United States Patent [19]

Saitoh et al.

[11] Patent Number: 4,771,447
[45] Date of Patent: Sep. 13, 1988

[54] X-RAY SOURCE

[75] Inventors: Yasunao Saitoh; Ikuo Okada, both of Isehara; Hideo Yoshihara, Yokohama, all of Japan

[73] Assignee: Nippon Telegraph and Telephone Corporation, Tokyo, Japan

[21] Appl. No.: 857,112

[22] Filed: Apr. 29, 1986

[30] Foreign Application Priority Data

Apr. 30, 1985 [JP] Japan .................................. 60-91227
Jan. 24, 1986 [JP] Japan .................................. 61-12105

[51] Int. Cl.$^4$ ............................................. H05H 1/34
[52] U.S. Cl. ..................................... 378/119; 378/34; 378/122; 250/492.2
[58] Field of Search .................................. 378/34–35, 378/83, 122, 119; 250/399, 492.2, 505.1; 376/144–145, 128

[56] References Cited

U.S. PATENT DOCUMENTS 2,379,397  6/1945  Zunick .
4,494,043  1/1985  Stallings et al. .................... 376/144
4,635,282  1/1982  Okada et al. ......................... 378/34
4,644,576  2/1987  Kuyel .................................. 378/122

FOREIGN PATENT DOCUMENTS 1051616  10/1983  U.S.S.R. ............................. 378/122

OTHER PUBLICATIONS

Article by C. Stallings et al; Imploding Argon Plasma Experiments, Appl. Phys. Lett., 35(7), Oct. 1st, 1979, pp. 524–526.
Article by J. S. Pearlman et al; X-ray Lithography Using a Pulsed Source; J. Vac. Sci. Technol., 19(4), Nov./Dec. 1981, pp. 1190–1193.
Article by J. Bailey; Evaluation of the Gas Puff Z Pinch as an X-ray Lithography Microscopy Source; Appl. Phys. Lett., 40(1), Jan. 1, 1982, pp. 33–35.

Primary Examiner—Craig E. Church
Assistant Examiner—John C. Freeman
Attorney, Agent, or Firm—Spencer & Frank

[57] ABSTRACT

In a gas injection type plasma X-ray source, a through hole communicated with vacuum is provided in each one of a pair of plasma-forming electrodes. This leads to a decrease in the dose of charged particles, a high temperature gas, etc. reflected from the upper electrode and inflicting damage on an X-ray extraction window. Accordingly, the thickness of the X-ray extraction window can be so decreased as to raise the X-ray extraction efficiency. Besides, evacuation of a space between the electrodes can be quickened. Accordingly, X-ray emission can be effected at a high repetition frequency. When the normal line direction of the electrode is inclined relative to the direction of the X-ray extraction, the effects mentioned above are enhanced.

16 Claims, 22 Drawing Sheets

PRIOR ART
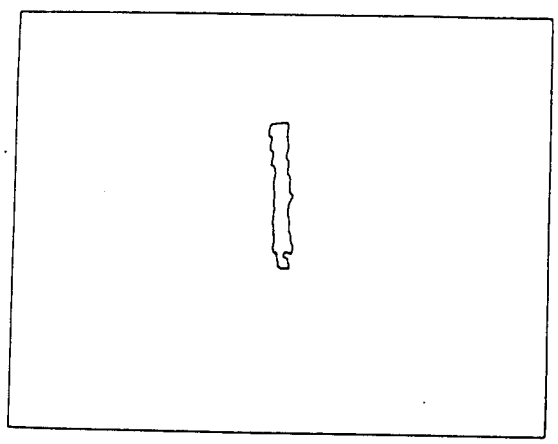
FIG. 4  |← 10mm →|
PRIOR ART
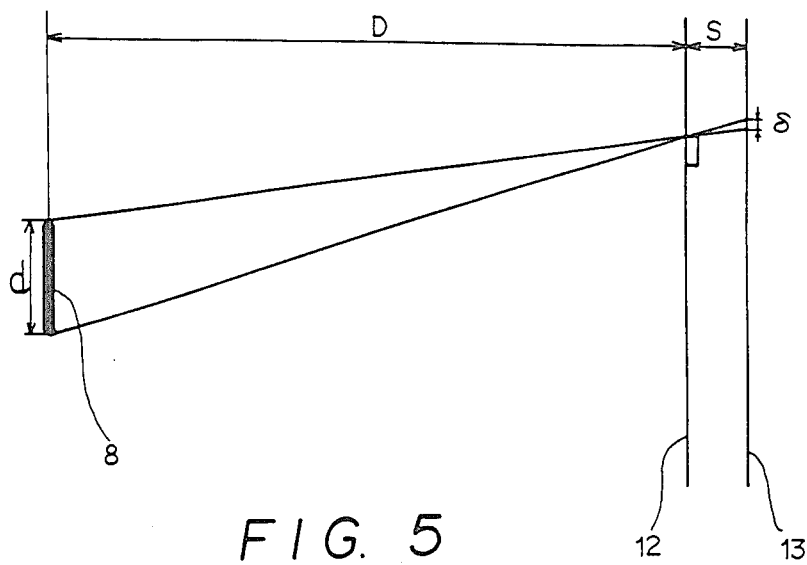
FIG. 5

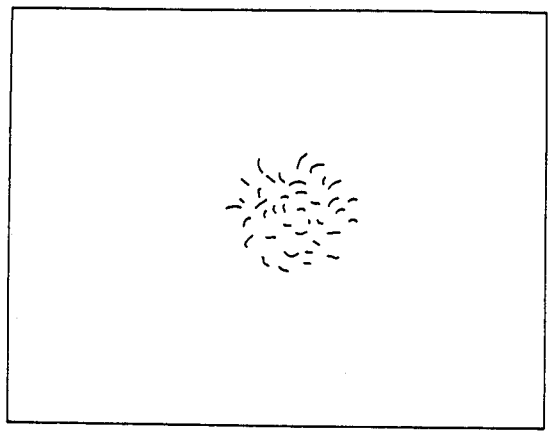
F I G. 20  |←→|  
1cm
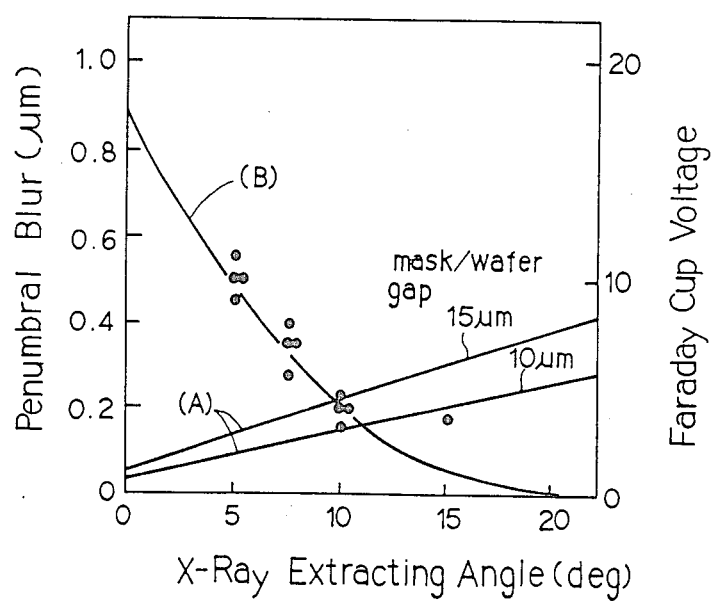
F I G. 22

X-RAY SOURCE

BACKGROUND OF THE INVENTION

1. Field of the Invention

The present invention relates to a plasma X-ray source for generating high power and highly stable soft X-rays to be used in an exposure apparatus for replicating a fine pattern to be used in the fabrication of semiconductor integrated circuits and others.

2. Description of the Prior Art

With a trend toward higher density integration in integrated circuits, a fine and highly accurate replicating technique has become necessary. Such a technique includes an X-ray lithography method. The X-ray source of an X-ray lithography apparatus has heretofore employed an electron impact system which generates X-rays by bombarding a solid such as aluminum, silicon, or palladium, with electron beams. However, this has involved a problem of such a low productivity that no high output of X-rays can be obtained at a low X-ray generation efficiency in the order of $10^{-4}$. An X-ray source which solves this problem is a plasma X-ray source which can be expected to generate X-rays with a higher output at a higher X-ray generation efficiency as compared with the electron impact X-ray source. Plasma X-ray sources include those of capillary discharge, plasma focus, and gas injection discharge types. In the capillary discharge type plasma X-ray source, vaporized polyethylene forms a high density plasma which generates only X-rays with long wavelengths. Thus, it is not suitable for X-ray lithography. On the other hand, the plasma focus discharge type X-ray source involves a problem of poor X-ray output stability due to contamination of an insulator surface which generates discharge initially. In contrast to these plasma X-ray sources, the gas injection discharge type X-ray source provides wavelengths suitable for X-ray lithography, and has a good X-ray generation stability.

Stallings et al. disclose X-ray emission from an imploding argon plasma ("Imploding argon plasma experiments", Appl. Phys. Lett. 35 (7), 1979, pp. 524–526). Okada et al. disclosed an X-ray source in which X-rays are extracted in the axial direction of a pinched plasma, and an X-ray lithography method which utilizes such an X-ray source ("X-ray source and X-ray lithography method", U.S. Ser. No. 699,402 filed Feb. 7, 1985, European Patent Application No. 85101451.4 filed Feb. 11, 1985). Pearlman et al. and Bailey et al. disclosed X-ray lithography in which X-rays are extracted in the radial direction of a pinched plasma ("X-ray lithography using a pulsed plasma source", J. Vac. Sci. Technol., 19 (4). Nov./Dec. 1981, pp. 1190–1193) and ("Evaluation of the gas puff Z pinch as an X-ray lithography and microscopy source", Appl. Phys. Lett. 40 (1), 1 Jan. 1982, pp. 33–35), respectively.

FIG. 1 shows an example of a conventional X-ray lithography apparatus in which X-rays are extracted in the axial direction of a plasma by using a gas injection discharge type plasma X-ray source, and which includes a vacuum casing 1, a vacuum chamber 2, a vacuum pump 3, and an upper electrode 4 and a flange 4B for supplying an electric current to the upper electrode 4. A gas passage 4C is provided in the upper electrode 4. The flange 4B includes a fast acting puff valve 5 composed of a gas plenum 5A and a piston 5B. The gas plenum 5A is connected to the upper gas passage 4C in the upper electrode 4 via a gas passage 5C. Illustration of a means for driving the piston 5B in the figure is omitted. A lower electrode 6 has a mesh or an opening 6A confronting the upper electrode 4 and openings 6C for gas evacuation. Reference numeral 6B is a flange for supplying an electric current to the lower electrode 6. FIG. 1 further includes a gas jet 7 ejected from the gas passage 4C, a pinched plasma 8, X-rays 9 generated, a particle beam 10, an X-ray extraction window 11, a mask 12, a wafer 13, a charged particle remover 14 comprising two permanent magnets, and an insulator 15 for insulating the flanges 4B and 6B, and the vacuum casing 1. The flange 6B is connected with a condenser 16 via a lead wire 18. The flange 4B is connected with one side of a discharge switch 17, the other side of which is connected with the condenser 16.

Gas injection discharge is performed as follows. The vacuum chamber 2 is evacuated with a vacuum pump 3 to about $10^{-5}$ to $10^{-6}$ Torr, while a discharge gas such as neon or krypton is introduced from a gas bomb 19 into the fast acting puff valve 5. After charging the condenser 16 with a charging power source 20, a power source 22 for the fast acting puff valve 5 is operated in response to a signal from a signal generator 21 to drive the fast acting puff valve 5. Thus, a gas jet is formed between the upper electrode 4 to which a high voltage is applied and the confronting lower electrode 6, while at the same time a signal from the signal generator 21 is inputted into a high voltage pulse generator 24 via a delay unit 23 which is so set to allow the time of discharge gas injection between the upper electrode 4 and the lower electrode 6 to agree with the time of discharge initiation. The discharge switch 17 is operated by a high voltage pulse to apply a high voltage across the upper electrode 4 and the lower electrode 6 which are illustrated by the insulator 15, to ionize the gas jet 7. Thus, a cylindrical plasma is formed. The plasma is converged by the interaction of the magnetic field formed by an electric current flowing along the direction of the central axis of the cylindrical plasma (hereinafter referred to as the "direction of the plasma axis") with ions and electrons in the plasma. Thus, the plasma is compressed to form a high temperature and high density plasma 8. X-rays 9 are generated by the interaction of ions and electrons in the high temperature and high density plasma 8. Besides X-rays, a particle beam 10 composed of charged particles such as ions and electrons, and a high temperature gas is emitted. A large amount of a high energy particle beam 10 is radiated in the direction of the central axis of the electrode.

In the case of exposure in the direction of the plasma axis which is suitable for fine pattern replication due to a small diameter of the source of X-rays, the damage of the X-ray extraction window 11 due to particles and light with a high energy which come flying in the direction of the plasma axis grow serious. In order to avoid the damage due to the charged particles during exposure in the direction of the plasma axis, use has heretofore been made of a method in which the charged particle remover 14 having mutually confronting magnets is inserted between the pinched plasma 8 and the X-ray extraction window 11 as shown in FIG. 1 to remove the charge particles by the magnetic field of the charged particle remover. In this method, however, almost all of the charged particles reflected from the upper electrode having a gas injection passage are radiated toward the X-ray extraction window. And the amount of the charged particles so notably increase in th direction toward the X-ray extraction window that the charged particles cannot be perfectly removed by only the charged particle remover. Use has also been made of an improved method in which a plasma reflection plate is disposed as a plasma remover having an X-ray passage hole in the center thereof in the magnetic field of the charged particle remover 14 to remove the charged particles, the high temperature gas, etc. due to the effect of not only deflection of the charged particles by the magnetic field but also reflection of the plasma by the plasma reflection plate. However, their removal cannot be perfect yet. In view of this, use has been made of an X-ray extraction window made of a thick beryllium film for preventing the X-ray extraction window 11 from being damaged. However, this increases X-ray attenuation to provide such a poor X-ray extraction efficiency as to prolong the period of time required for X-ray lithography, thus leading to a problem of reduction in throughput.

In order to avoid non-uniform exposure, 10 to 20 shots of discharge are repeated in one field exposure. Repeated discharge involves repetition of evacuation, gas injection, and discharge. In conventional apparatus, however, an increase in the speed of discharge repetition entails such insufficient gas evacuation around the discharge electrodes 4 and 6 that abnormal discharge in portions other than the vicinity of the electrodes 4 and 6 is liable to occur, leading to reduction in the X-ray output. Therefore, a repetition frequency of about 1 Hz must be adopted for securing a stable X-ray output. Thus, no improved throughput can be expected.

When a plasma is pinched and collapsed, a gas which collides with the upper electrode and is reflected from the upper electrode is radiated toward the X-ray extraction window. This results in such insufficient exhaustion of the gas present in the direction of the X-ray extraction window during high frequency repetition of discharge that X-rays advancing toward the X-ray extraction window are attenuated by the gas. As shown in FIG. 2, the output of X-rays with a wavelength of 12 Å are decreased about ½ when a neon gas of 70 Torr is present in a thickness of about 1 to 2 cm around the center of the lower electrode.

Since a high temperature and high density plasma is radiated in the direction of the plasma axis, the central portion of the upper electrode is largely lost and the molten electrode substance is scattered to contaminate the X-ray extraction window.

FIG. 3 shows another conventional X-ray lithography apparatus. In order to avoid the influence of a particle beam comprising charged particles, a high temperature gas, etc., this apparatus utilizes a phenomena that the radiation dose of the particle beam 10 in the radial direction of the plasma is 1/100 to 1/1000 of that in the direction of the plasma axis. More specifically, the X-ray extraction window 11, the mask 12, a wafer, etc. are disposed in the radial direction of the pinched plasma 8 to extract X-rays through a hole 6D provided in the electrode 6 and the X-ray extraction window 11 for effecting exposure. Illustration of a discharge gas feed system and an electric system for discharging is omitted in FIG. 3. FIG. 4 is a form of an X-ray source photographed from the radial direction of the X-ray source in which direction an X-ray mask is disposed, according to X-ray pinhole photography. In the case of such exposure in the radial direction, when proximity lithography is performed at a mask-wafer gap of 10 to 20 μm, the penumbral blur δ=ds/D, which is determined by the length d of a pinched plasma, namely a source of X-rays, the distance D to the source of X-rays, and the distance s between the mask and the wafer as shown in FIG. 5 so increase that fine pattern replication cannot be made.

SUMMARY OF THE INVENTION

An object of the present invention is to provide an X-ray source of a long life span less liable to undergo damages to its X-ray extraction window and electrodes for forming a plasma, which obviates the defects of the conventional X-ray sources.

Another object of the present invention is to provide an X-ray source capable of extracting a high power output of X-rays from an X-ray extraction window.

Still another object of the present invention is to provide an X-ray source capable of discharging at a high repetition frequency without abnormal discharge.

In a first aspect of the present invention, an X-ray source comprises:

a pair of electrodes opposing each other in a vacuum chamber for forming a linear plasma, each electrode having a through hole, of which an opening opposing an opening of another electrode is in line with the linear plasma, the through hole communicating with vacuum;

a gas valve for introducing a gas for forming a plasma between the pair of electrodes;

a means for applying an electric field to at least one of the electrodes to cause discharge between the pair of electrodes to form a discharge plasma for emitting X-rays from a pinched linear plasma of the discharge plasma; and an X-ray extraction window for extracting X-rays emitted from the plasma out of the vacuum chamber.

Here, the through hole of one of the pair of electrodes may have branches.

The through hole of one electrode of the pair of electrodes may be communicated with a vacuum evacuator.

The X-ray source may further comprise a charged particle remover capable of deflecting charged particles by a magnetic field formed by a pair of magnets disposed between the electrodes and the X-ray extraction window.

The X-ray source may further comprise a particle beam reflection plate provided in the magnetic field.

Here, the X-ray extraction window may comprise a first film for resisting a thermal energy and light energy emitted from the plasma, a second film for sealing the vacuum chamber and a third film which is disposed on an outer side of the X-ray extraction window via a helium gas filled between the third film and the second film.

In a second aspect of the present invention, an X-ray source comprises:

a pair of electrodes for forming a linear plasma opposing each other in a vacuum chamber;

a gas valve for injecting a gas capable of forming a plasma between the pair of electrodes;

a means for applying an electric field to at least one of the electrodes to cause discharging between the pair of electrodes to form a discharge plasma for effecting emission of X-rays from a pinched linear plasma of the discharge plasma; and an X-ray extraction window(s) for extracting X-rays emitted from the plasma out of the vacuum chamber in a direction slightly inclined relative to the axial direction of the plasma, so that a particle beam emitted from the plasma does not impinge against the X-ray extracting window(s).

Here, an X-ray source may further comprise a charged particle remover capable of deflecting charged particles by a magnetic field formed by a pair of magnets disposed between the electrodes and the X-ray extraction window(s).

An X-ray source may further comprise a particle beam reflection plate provided in the magnetic field.

Here, the X-ray extraction window(s) may comprise a first film for resisting a thermal energy and light energy emitted from the plasma, a second film for sealing the vacuum chamber and a third film which is disposed on an outer side of the X-ray extraction window(s) via a helium gas filled between the third film and the second film.

The X-ray source may further comprise a plurality of X-ray extraction windows.

In a third aspect of the present invention, an X-ray source comprises:

a pair of electrodes opposing each other in a vacuum chamber for forming a linear plasma, each electrode having a through hole, of which an opening opposing an opening of another electrode is in line with the linear plasma, the through hole communicating with vacuum;

a pass valve for injecting a gas capable of forming a plasma between the pair of electrode;

a means for applying an electric field to at least one of the electrodes to cause discharging between the pair of electrodes to form a discharge plasma for effecting emission of X-rays from a pinched linear plasma of the discharge plasma; and an X-ray extraction window for extracting X-rays emitted from the plasma out of the vacuum chamber in a direction slightly inclined relative to the axial direction of the plasma, so that a particle beam emitted from the plasma does not impinge against the X-ray extracting window.

Here, the through hole of one of the pair of electrodes may have branches.

The through hole of one electrode of the pair of electrodes may be communicated with a vacuum evacuator.

The X-ray may further comprise a charged particle remover capable of deflecting charged particles by a magnetic field formed by a pair of magnets disposed between the electrodes and the X-ray extraction window.

The X-ray source may further comprise a particle beam reflection plate provided in the magnetic field.

Here, the X-ray extraction window may comprise a first film for resisting a thermal energy and light energy emitted from the plasma, a second film for sealing the vacuum chamber and a third film which is disposed on an outer side of the X-ray extraction window via a helium gas filled between the third film and the second film.

The above and other objects, effects, features and advantages of the present invention will become more apparent from the following description of preferred embodiments thereof taken in conjunction with the accompanying drawings.

BRIEF DESCRIPTION OF THE DRAWINGS

FIG. 4 illustrates an X-ray pin-hole picture of the conventional apparatus as shown in FIG. 3;

FIG. 5 illustrates a penumbral blur in the conventional apparatus as shown in FIG. 3;

FIGS. 15 to 20 are schematic views showing X-ray lithography apparatuses to which other examples of the X-ray source of the present invention are respectively applied, in which;

FIG. 15 is concerned with an example wherein gas injection is performed from the side of the lower electrode;

FIGS. 16 and 17 are concerned with examples wherein a discharge electrode having a through hole is combined with an X-ray extraction window having a triple window structure;

FIG. 18 is a schematic view showing an example of the present invention;

FIG. 19 is an enlarged view showing the discharge electrode of FIG. 18;

FIG. 20 illustrates the state of the damage inflicted by a particle beam released from a plasma in the direction of the plasma axis;

FIG. 22 illustrates a relationship between the X-ray extraction angle, the penumbral blur, and the arriving ion dose;

DETAILED DESCRIPTION OF PREFERRED EMBODIMENTS

Embodiment 1

Figure 1:
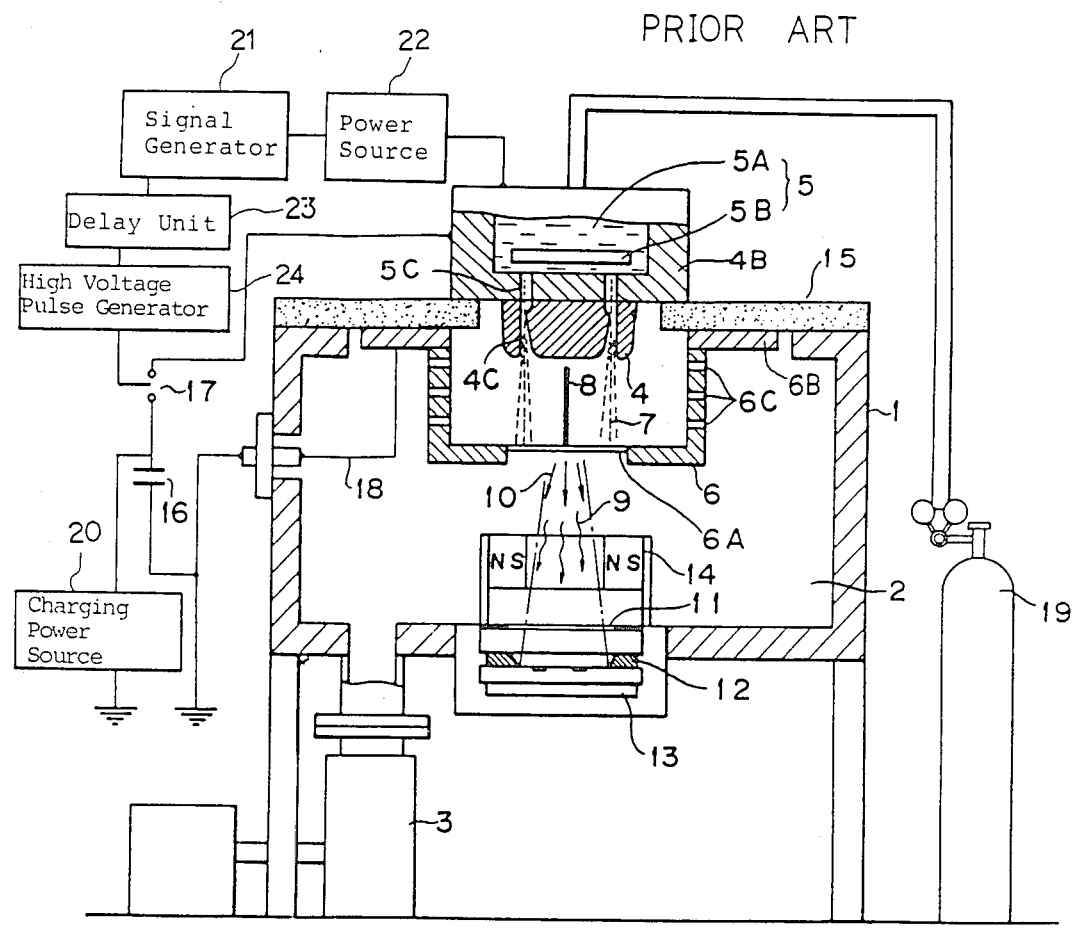
FIG. 1 is a schematic view showing an X-ray lithography apparatus using a conventional X-ray source.
Figure 2:
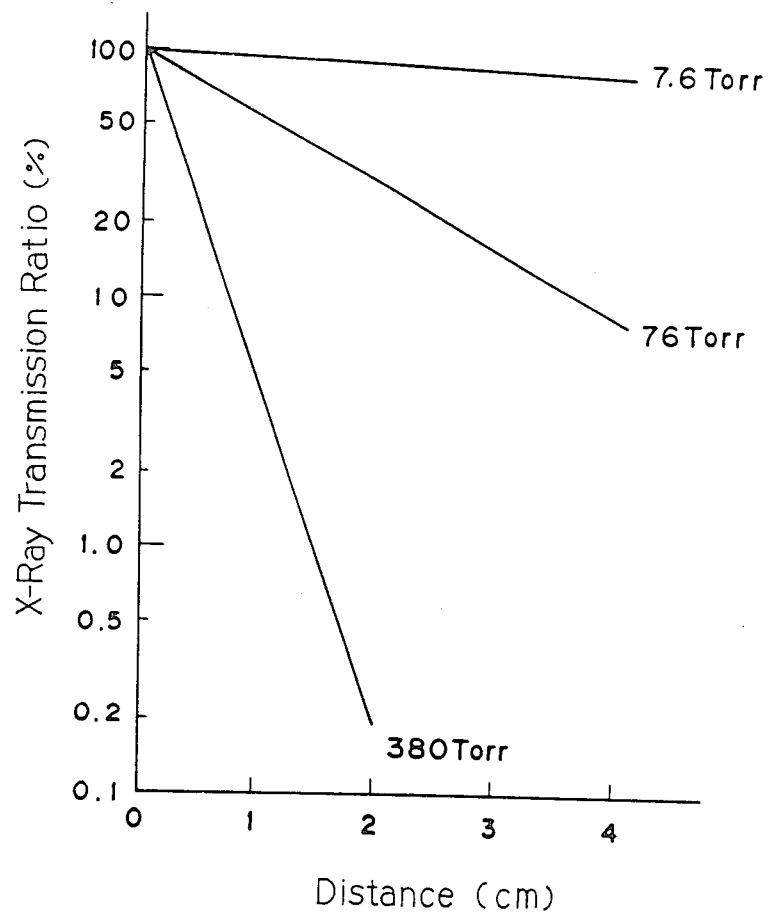
FIG. 2 is a diagram showing a relationship between the distance of X-ray transmission through a neon gas and the X-ray transmittance at a wavelength of 12 Å with the neon gas pressure as a parameter.
Figure 3:
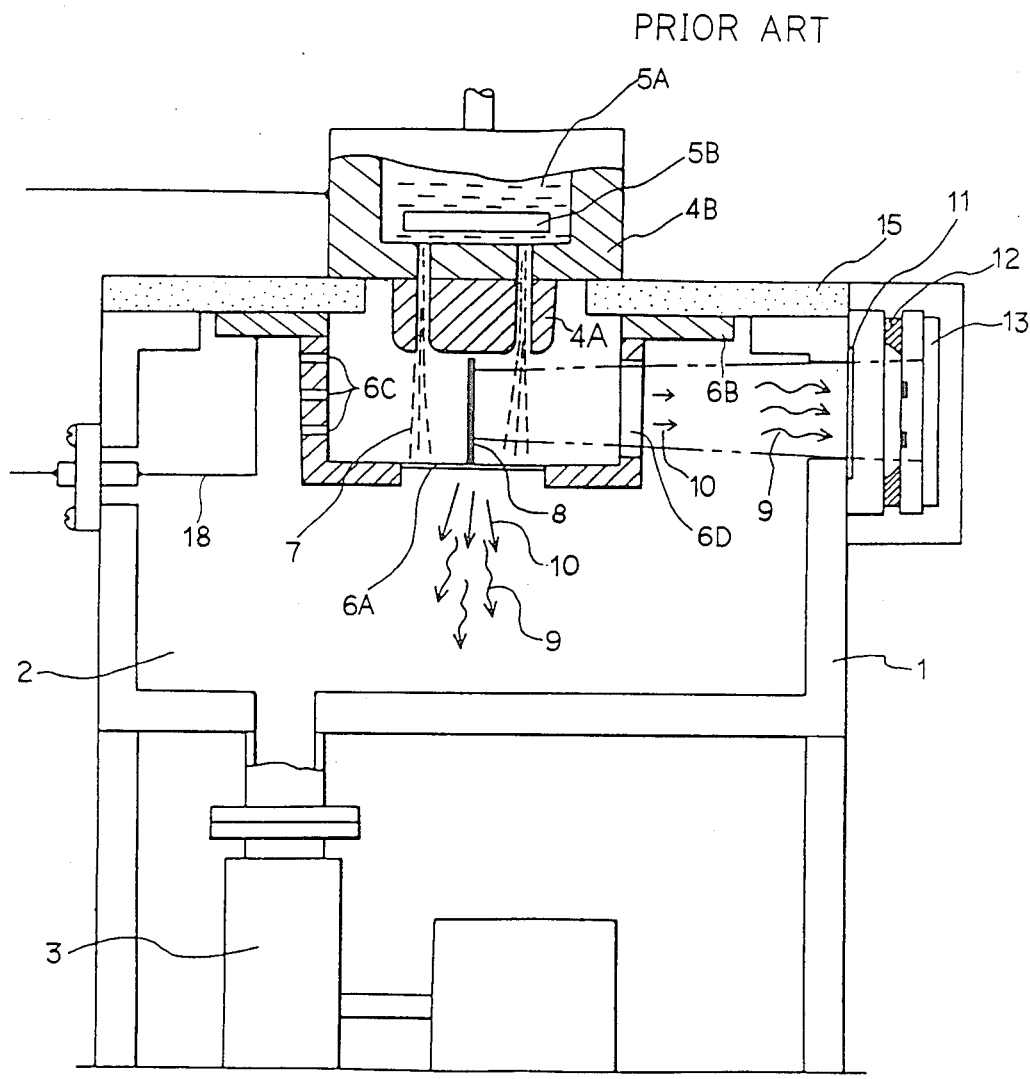
FIG. 3 is a schematic view showing another X-ray lithography apparatus using a conventional plasma X-ray source.
Figure 6:
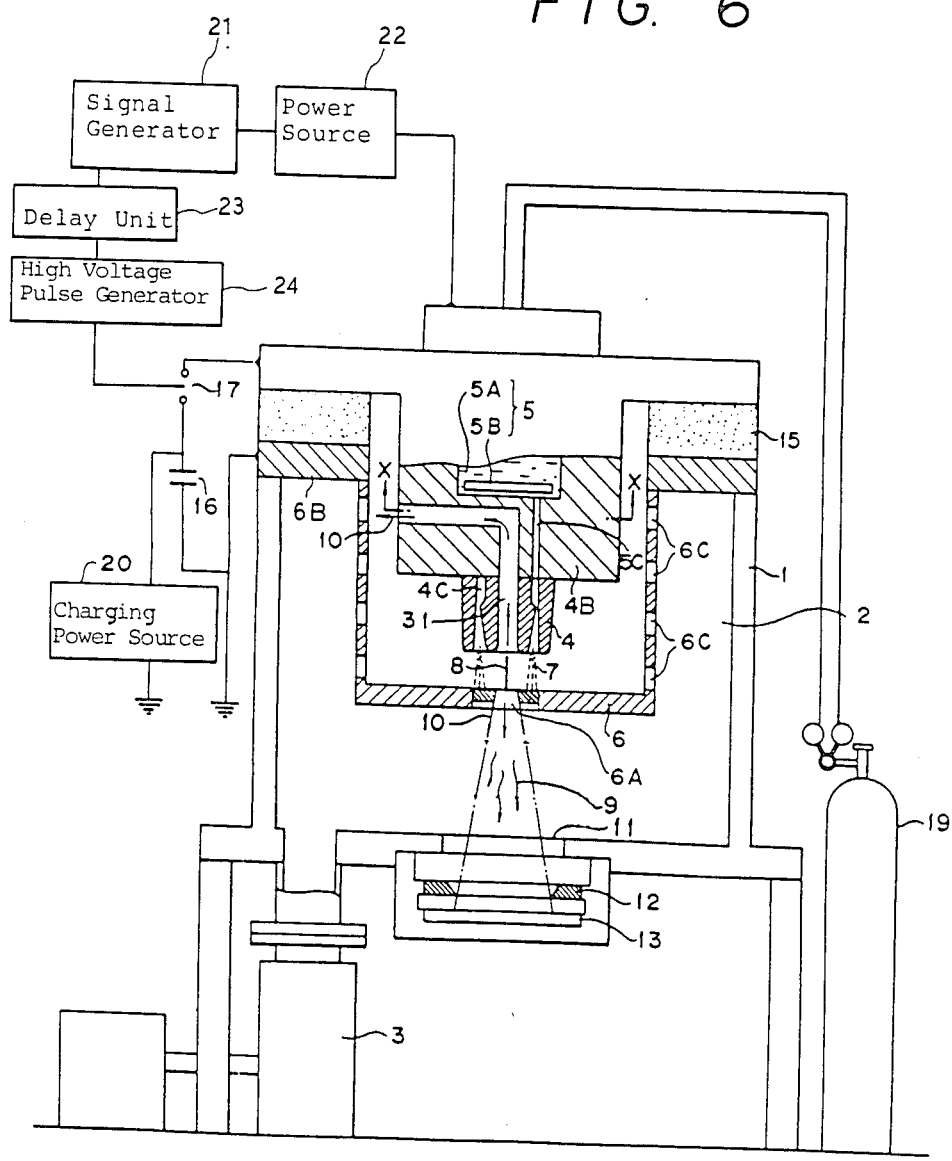
FIG. 6 is a schematic view showing an X-ray lithography apparatus to which an example of the X-ray source of the present invention is applied.
Figure 7:
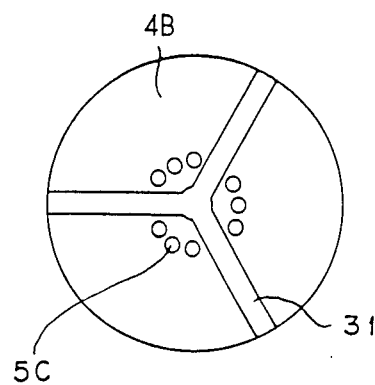
FIG. 7 is a cross-sectional view, along the line X—X in FIG. 6.

FIG. 6 shows an example of an X-ray lithography apparatus using an embodiment of the X-ray source according to the present invention, which comprises an improved structure of an upper electrode. The same parts in FIG. 6 as in the conventional apparatus as shown in FIG. 1 are accompanied by the same referential numbers as in FIG. 1, and descriptions thereabout will be omitted. The most notable difference of this embodiment from the conventional X-ray sources consists in that the upper electrode 4 has a through hole 31 having one open end in the face confronting a lower electrode 6 and the other open end in the side face of flange 4B. The upper electrode 4 and flange 4B are inserted so deep in a vacuum chamber 2 that every open end of the through hole 31 is perfectly present inside the vacuum chamber. The form of the lower electrode is adapted to the upper electrode 4. A space between the upper electrode 4 and the lower electrode 6 is evacuated through holes 6C by a vacuum pump 3. FIG. 7 shows the cross-sectional view, along the line X—X, of the flange 4B of the upper electrode 4 as shown in FIG. 6. In this figure, an example is shown in which the through hole 31 are extended upward in the central portion of the upper electrode 4, branched in three directions in the inside of the flange 4B, and opened at three portions of the side face of the flange 4B. However, the branching is not limited to three direction. Besides, no branching is also possible. A gas plenum 5A is connected with a gas passage 4C insides the upper electrode 4 through a gas passage 5C. Although FIG. 7 exemplifies disposition of a number of circular tube passages as the gas passages 5C (4C), a number of circular arcs, in cross section, of passages may be disposed as the gas passage 5C (4C). In the case of a non-branched through hole, the cross-sectional view of the gas passage may have a ring form.

The embodiment as shown in FIG. 6 is operated in the same manner as in the conventional apparatus as described hereinbefore. More specifically, the vacuum chamber 2 is evacuated to about $10^{-5}$ to $10^{-6}$ Torr. A gas is injected between the electrodes 4 and 6 to form a gas jet 7. A high voltage is applied across both the electrodes to cause discharge. Thus, a plasma 8 is formed to generate X-rays. For example, copper, a copper-tungsten alloy, or the like is used in the electrodes 4 and 6. The time of X-ray generation per single discharge operation is less than 1 μs or less. The exposure operation is effected by repeating cycles of evacuation -gas injection-discharge-X-ray generation.

Besides X-rays 9, the particle beam 10 composed of ions, electrons, a high temperature gas, etc. generated in the course of collapse of a high density plasma is emitted from the plasma pinched between the electrodes. X-rays are isotropically radiated from all points of the plasma toward all directions, while the ions, the electrons, the high temperature gas, etc. are emitted mainly in the axial direction of the plasma. Since also the upper electrode 4 on the side of gas injection in the axial direction of the plasma has a through hole 31, absorption of the particle beam emitted from the pinched plasma 8 is effected even on the side of the upper electrode 4 in addition to the direction toward the X-ray extraction window 11. Therefore, the dose of the particle beam flying against the X-ray extraction window is so decreased that the damage of the X-ray extraction window can be so reduced as to allow the thickness of the window material to be reduced.

Embodiment 2

Figure 8:
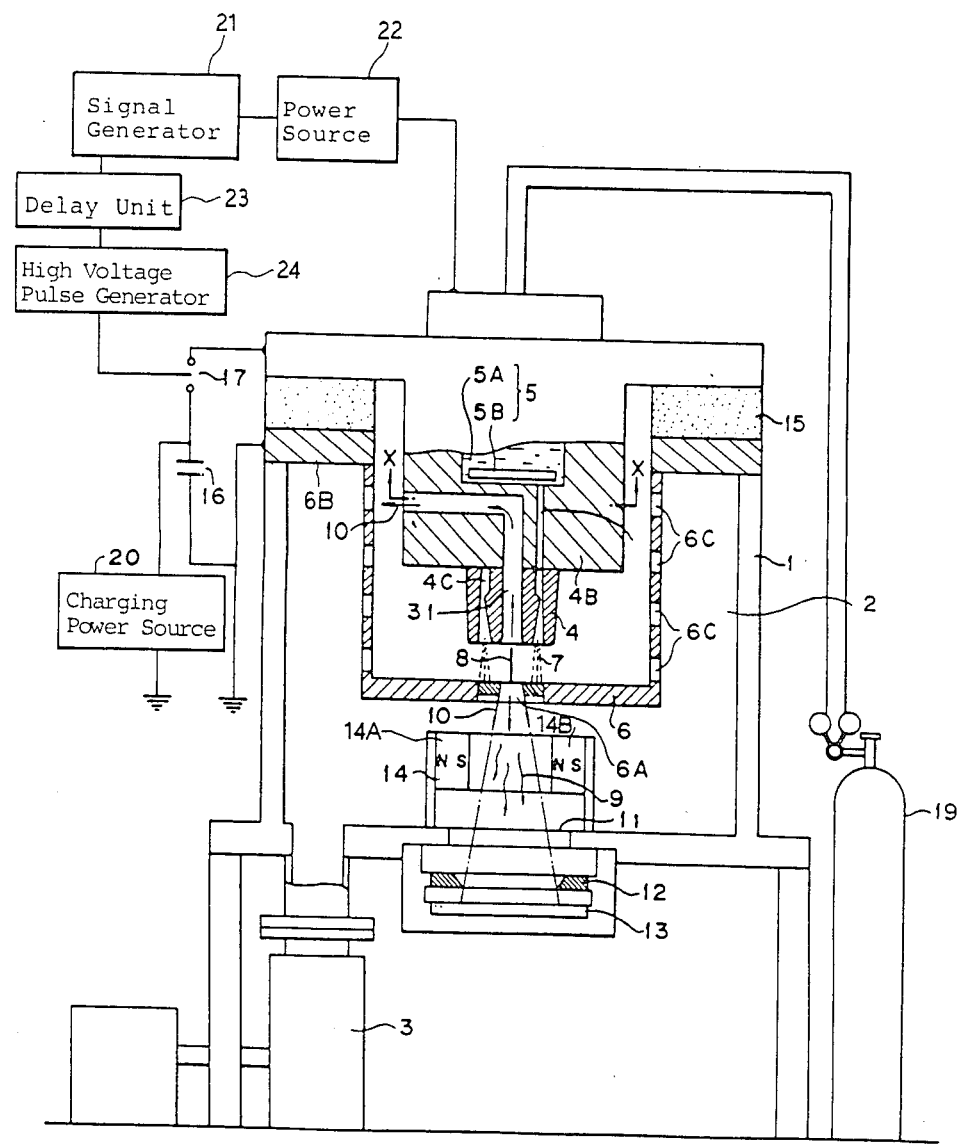
FIG. 8 is a schematic view showing still another example of the present invention.

FIG. 8 shows still another embodiment of the present invention. The apparatus in this embodiment additionally comprises a charged particle remover 14 in the structure of the embodiment as shown in FIG. 6. The charged particle remover 14 comprises a pair of permanent magnets confronting each other which deflect incident charged particles by their magnetic field to remove the same. Even if such a charged particle remover is provided in a conventional apparatus, charged particles cannot be perfectly removed. In contrast, when the charged particle remover is combined with an upper electrode having a through hole according to the present invention, a notable effect of preventing an X-ray extraction window from suffering the damage due to charged particles can be achieved.

Figure 9A:
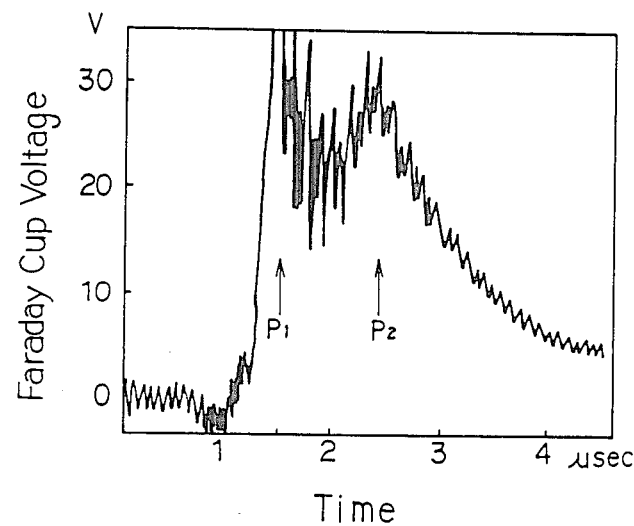
FIGS. 9A and 9B are characteristic curves respectively showing the Faraday cup voltage given by ions for illustrating the effect of through hole.
Figure 9B:
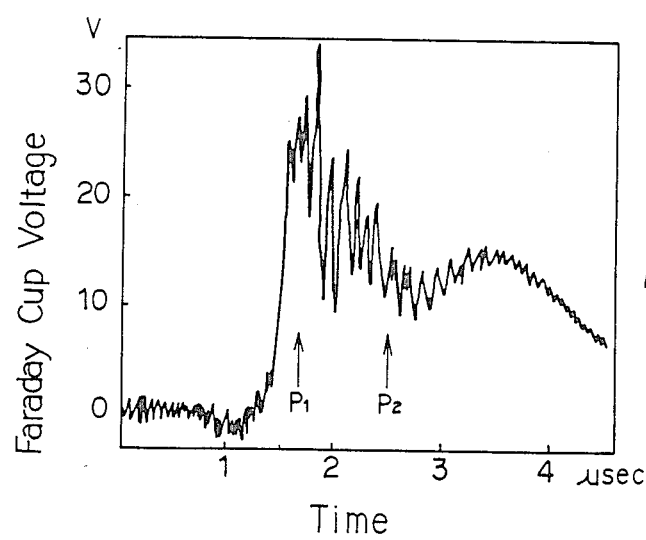

FIGS. 9A and 9B show the results of measurement of the electromotive force given by ions emitted toward the X-ray extraction window by means of a Faraday cup placed at the position of a mask 12 in a lithography apparatus as shown in FIG. 8. FIG. 9A is concerned with the case where conventional electrodes are used, while FIG. 9B is concerned with the case where an upper electrode 4 having a through hole 31 according to the present invention as shown in FIG. 8 is used. It will be understood that, in the latter case where the electrode having the through hole 31 is used, the dose of ions arriving at the X-ray extraction window as a component of a particle beam is smaller. Of two peaks in FIG. 9A, the first peak $P_1$ is assigned to ions directly flying from a plasma, the second peak $P_2$ is assigned to ions remain between the upper and the lower electrodes and accelerated by an electric field generated between the electrode after the plasma is pinched. In FIG. 9B, the first peak $P_1$ is smaller, thus indicating that part of charged particles are evacuated through the through hole 31, while the second peak $P_2$ substantially disappears, thus indicating that the dose of charged particles arriving at the X-ray extraction window is so decreased that the damage of the X-ray extraction 11 is markedly decreased. As shown in FIG. 9B, the dose of the particle beam flying toward the X-ray extraction window is so decreased that the damage of the X-ray extraction window 11 is reduced. Accordingly, reduction of the film thickness of the X-ray extraction window becomes possible. This can provide a higher X-ray extraction efficiency, leading to an improvement in throughput.

Figure 10:
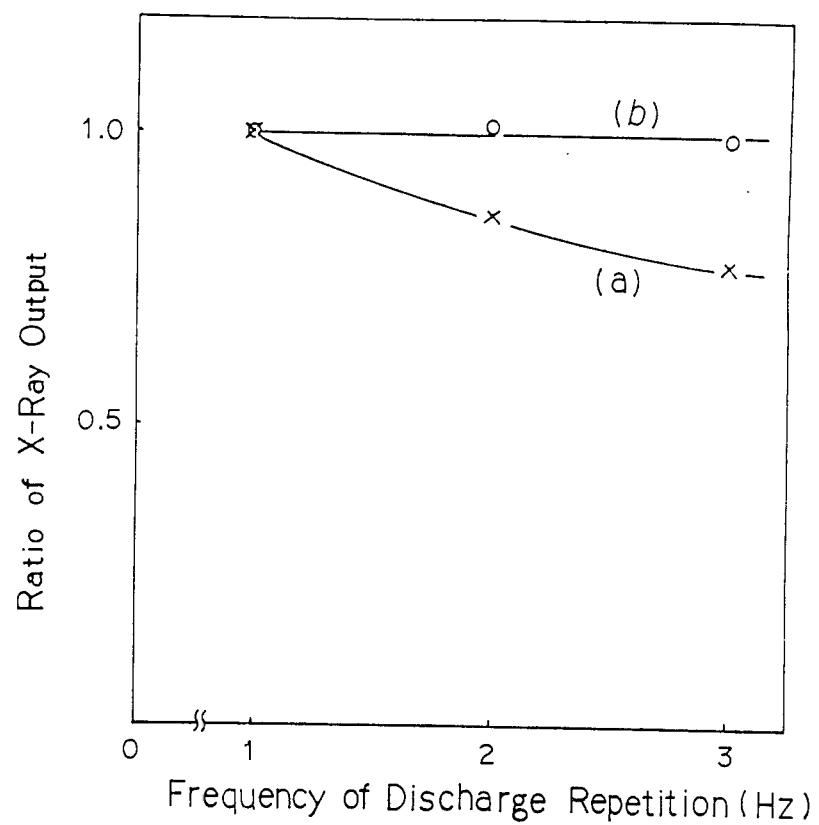
FIG. 10 is a diagram showing the relationship between the ratio of X-ray output and the frequency of discharge repetition.

As described hereinbefore, a gas injected between the electrodes must be quickly exhausted during repeated discharge for X-ray lithography. Insufficient gas exhaustion is liable to lead to abnormal discharge, resulting in a decrease in X-ray output. FIG. 10 shows the results of examination of the relationship between the frequency of repeated discharge and the X-ray output. In FIG. 10, the curve (a) is concerned with the case where conventional electrodes are used, while the curve (b) is concerned with the case where an X-ray source with an upper electrode 4 having a through hole 31 according to the present invention is used. When repeated discharge is performed at 3 Hz in the conventional X-ray source, the X-ray output is decreased to about 80% of that at 1 Hz. In contrast, in the case of the X-ray source of the present invention, even when it is operated at a frequency as high as 3 Hz, no abnormal discharge occurs to stably secure the same X-ray output as at 1 Hz. The reason for this is as follows. Since the upper electrode 4 has the through hole 31 having an opening provided in the face confronting the lower electrode, a pinched plasma is exhausted without collision with the upper electrode and reflection from the upper electrode. Therefore, gas exhaustion around the electrode is quickly effected, leading to the above-mentioned advantage.

Figure 11A:
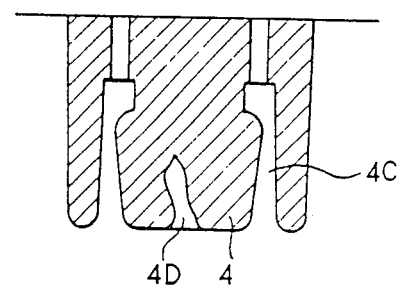
FIGS. 11A and 11B are cross-sectional views showing the states of a conventional electrode and an electrode according to the present invention, respectively, after 1,000 shots of discharge.
Figure 11B:
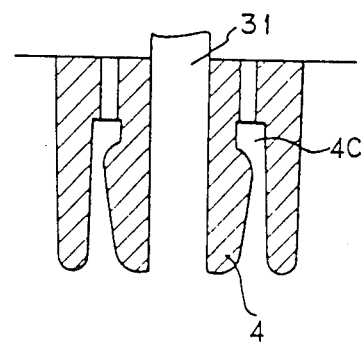

Furthermore, the X-ray source of this example is less subject to damage to the upper electrode thereof FIGS. 11A and 11B are cross-sectional views illustrating upper electrodes of copper after 1,000 shots of discharge. FIG. 11A is concerned with a conventional apparatus, while FIG. 11B is concerned with an embodiment according to the present invention. In the case of the conventional apparatus, the middle portion of the discharge electrode 4 is molten and lost as indicated by 4D. In contrast, the case of the embodiment according to the present invention as shown in FIG. 11B, the loss of the electrode is caused only to such an extent that the surface portion of the electrode slightly disappears, since the middle portion of the electrode has an opening to avoid localized collision of a high temperature and high density plasma against the electrode.

Figure 12:
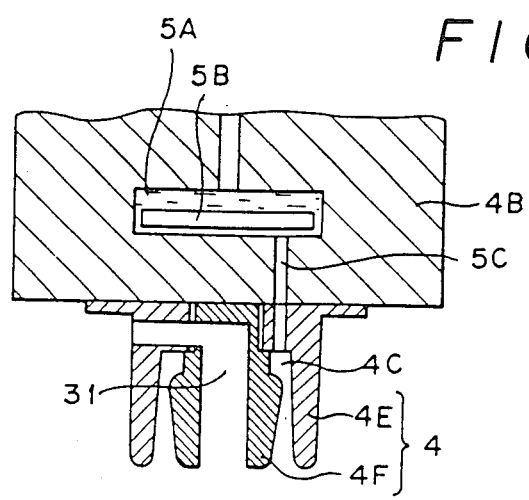
FIG. 12 is a cross-sectional view of another form of a through hole provided in a discharge electrode.

FIG. 12 shows another form of the through hole 31. In this example, one end of the through hole 31 is opened in the face of the discharged electrode 4 confronting the mesh or hole 6A of the discharge electrode 6, while the other end is opened in the side face of the discharge electrode 4. Such a form of the discharge electrode 4 is easily prepared by combining an outer cylinder 4E and an inner cylinder 4F as shown in the figure.

Embodiment 3

Figure 13:
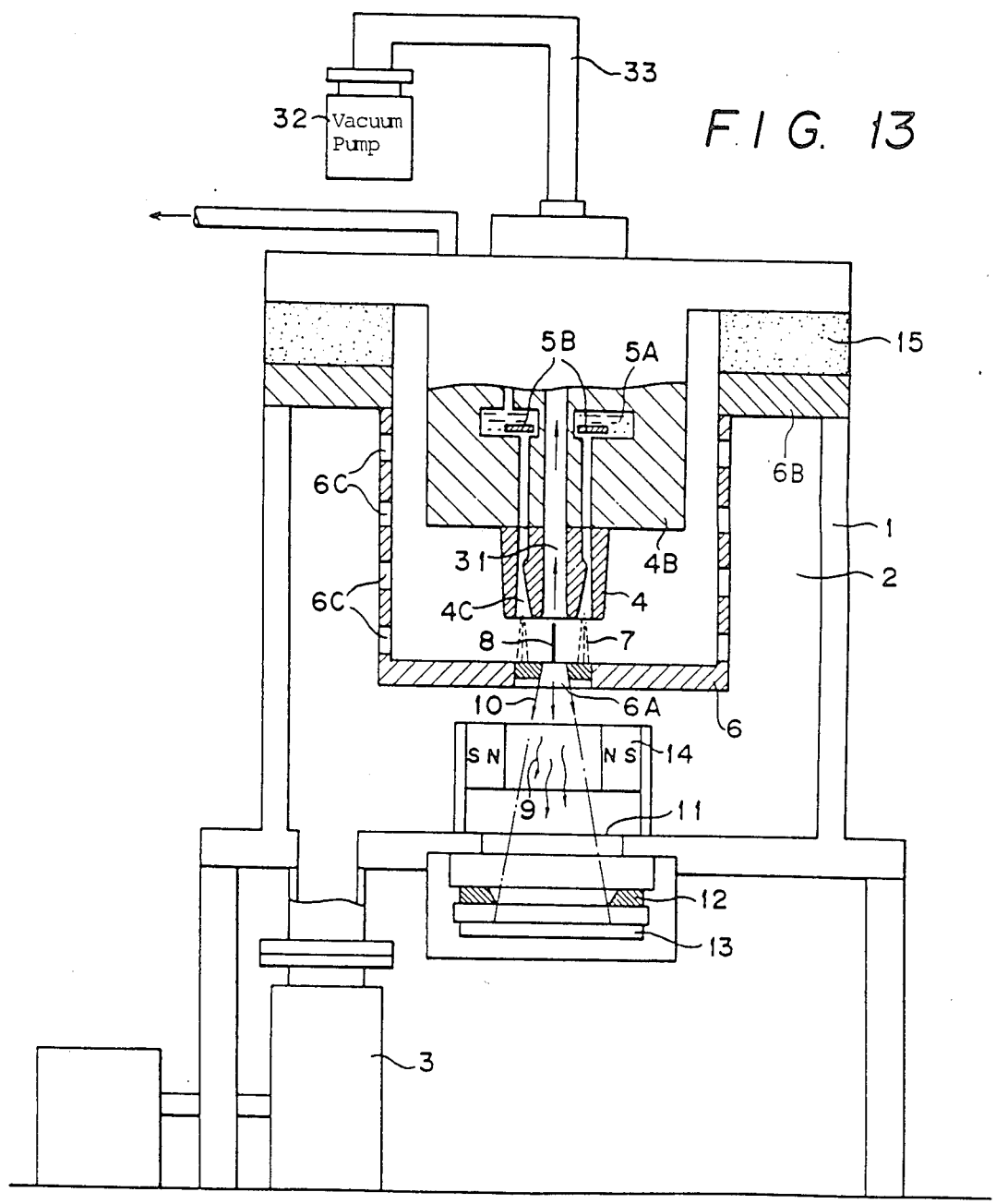
FIG. 13 is a schematic view showing an X-ray lithography apparatus to which another example of the X-ray source of the present invention is applied.

FIG. 13 shows still another embodiment according to the present invention. In the figure, illustration of a discharge gas supply system and an electric discharge system is omitted. In this embodiment, a through hole 31 of an upper electrode 4 is connected with another evacuator, which includes a vacuum pump 32 such as a turbo molecular pump and a piping system 33 connecting the through hole 31 of the upper electrode with the pump. A particle beam 10, generated in the axial direction of the plasma when the plasma is pinched, is exhausted through the through hole 31 of the upper electrode 4 and the piping system 33 means of the vacuum pump 32. Therefore, the dose of the particle beam 10 flying in the direction toward an X-ray extraction window 11 becomes small. This makes it possible to reduce the film thickness of the X-ray extraction window, leading to an improvement in the X-ray extraction efficiency.

Figure 14:
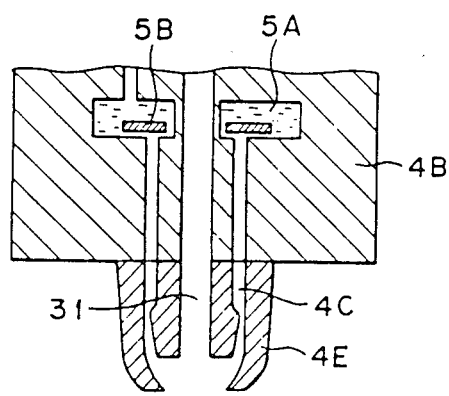
FIG. 14 is a cross-sectional view showing an example of the structure of the upper electrode.

FIG. 14 is a cross-sectional view illustrating still another form of the upper electrode 4. An injected gas is so concentrated around the center of the electrode by a curved tip of an outer cylinder 4E of the upper electrode 4 that evacuation through the through hole 31 can be further efficiently effected.

Embodiment 4

Figure 15:
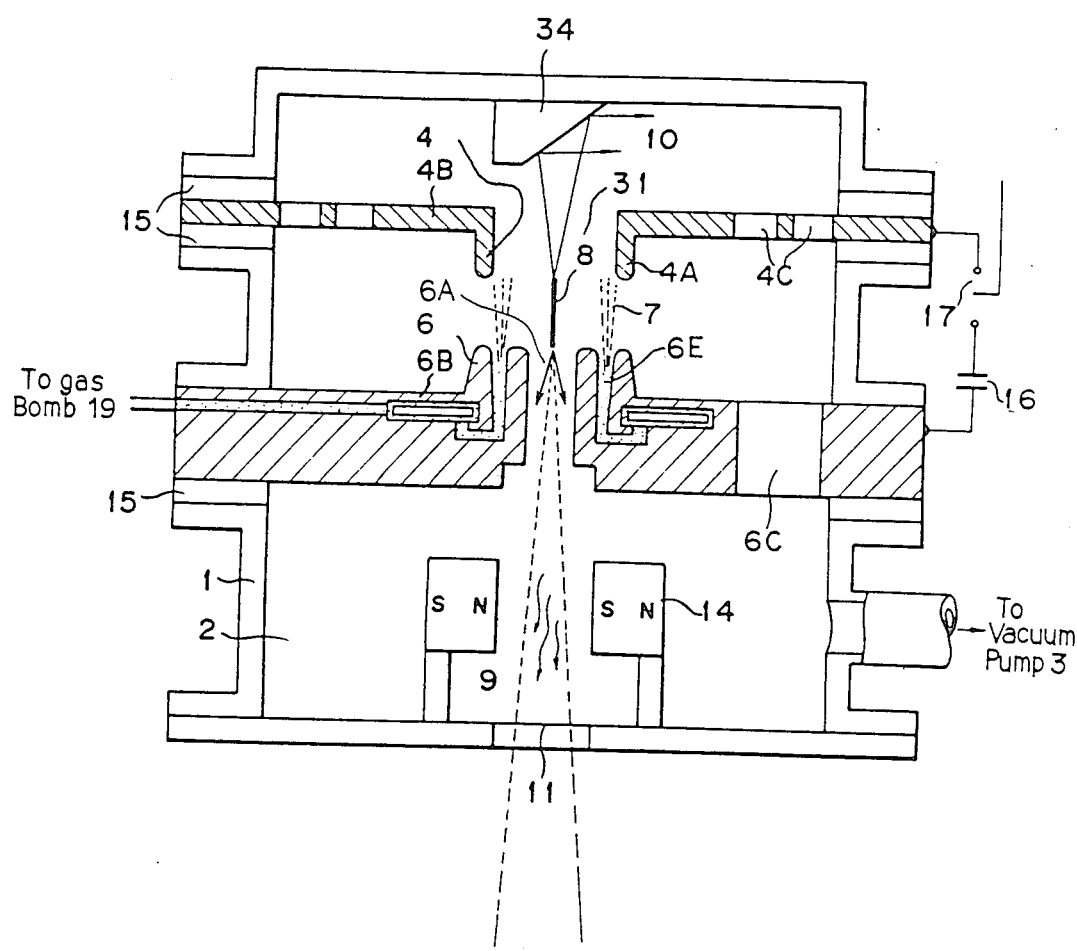

FIG. 15 shows still another embodiment according to the present invention. In this embodiment, a gas is injected from the side of a lower electrode 6. In FIG. 15, illustration of a discharge gas supply system and an electric system outside a vacuum chamber is omitted. Although a discharge gas is injected through a gas passage 6E from the side of the lower electrode, formation of a plasma and generation of X-rays ar effected in the same manner as in the examples as shown in FIGS. 6 and 13. The upper electrode 4 in this embodiment is cylindrical, and has a through hole 31 in the middle portion thereof. Since the particle beam 10 is exhausted through the through hole 31 toward the upper portion of the vacuum chamber, emission of the beam toward an X-ray extraction window 11 is reduced. When a heat-resistant block 34 is provided at a position just above the through hole 31 in the vacuum chamber 1 to reflect the particle beam 10 toward the lateral direction, the damage of the X-ray extraction window is small even if the height of the vacuum chamber is small, while at the same time exhaustion of the particle beam is conveniently effected.

Embodiment 5

Figure 16:
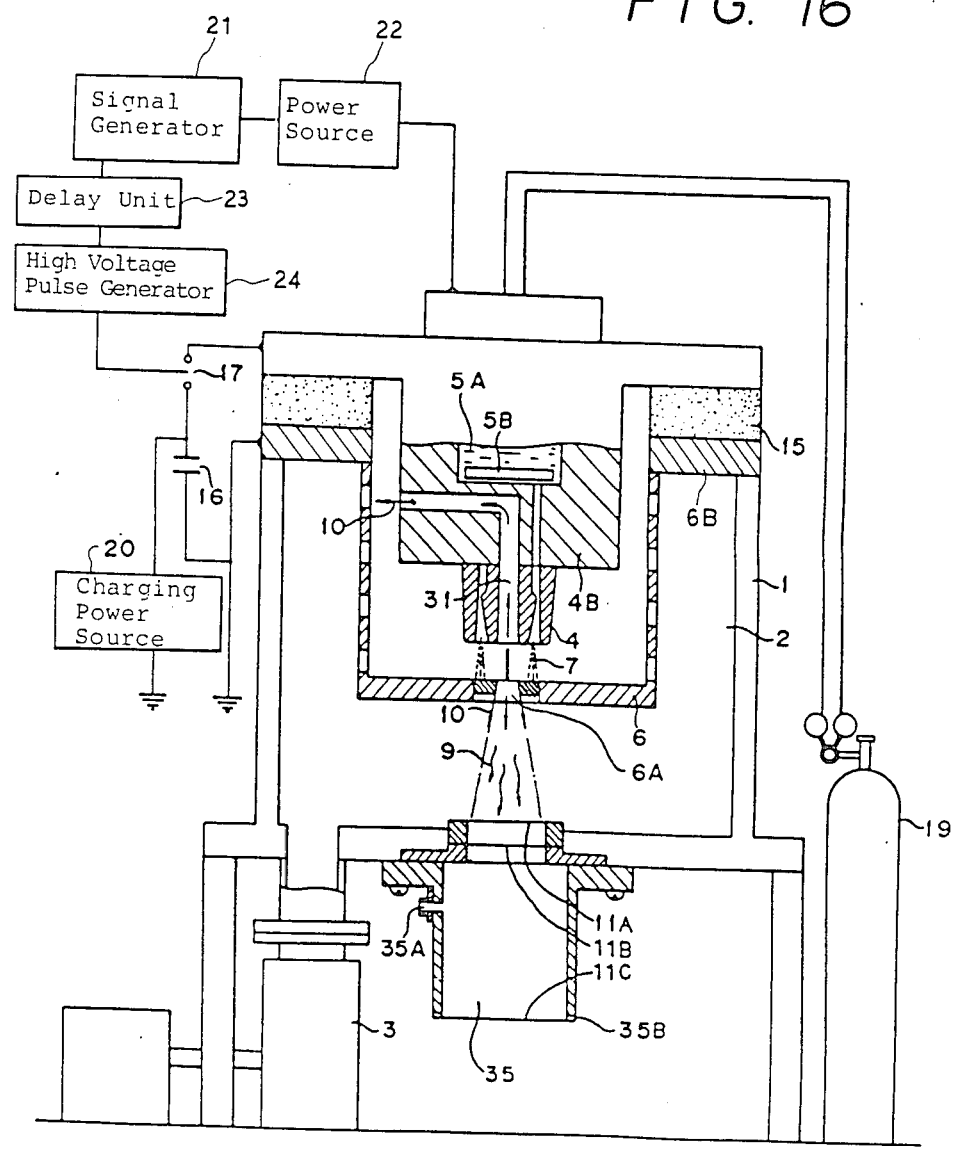

FIG. 16 shows still another embodiment according to the present invention. In this embodiment, an X-ray extraction window comprises a first film 11A and a second film 11B separated from each other, and a third film 11C on a lower side. Except for this feature, the constitution of this example is the same as in FIG. 6.

Although most of the particle beam is exhausted through the through hole 31, some of it is emitted toward the X-ray extraction window. The first film 11A is provided for shielding a high temperature gas molecules and charged particles and absorbing visible and ultraviolet rays, etc. Preferred examples of the first film include thin metallic films of beryllium, aluminium, titanium etc., which are relatively heat-resistant and good in X-ray transmission; inorganic films of carbon, Si-N, $SiN_4$, SiC, BN, etc.; organic films of polyimide, etc.; and composite films thereof. The second film 11B is provided for keeping vacuum. Preferred examples of the second film include thin metallic films of beryllium, aluminium, titanium, etc.; inorganic films of carbon, Si-N, $SiN_4$, SiC, BN, etc.; organic films of polypropylene, polyethylene terephthalate, polyimide, etc.; and composite films thereof. The second film may be reinforced by metallic meshes, carbon meshes, silicon meshes or the like. When the X-ray extraction window 11 comprises mutually separated two films, namely the first film 11A resistible against particles and heat energy emitted from the plasma and the second film 11B capable of bearing a pressure difference between the vacuum chamber 1 and the atmosphere, the sum of the thicknesses of the two films 11A and 11B can be rendered thinner than the thickness of the conventional X-ray extraction window made of a single film. Accordingly, an X-ray extraction window having a high X-ray transmittance and a long life span can be materialized. For example, the life span of an X-ray extraction window comprising a first film 11A of 7 $\mu$m Be and a second film 11B of 10 $\mu$m Be is longer than that of a conventional X-ray extraction window made of a single Be film of 20 $\mu$m.

A mask and a wafer or the like are placed under a third film 11C. In general, part of an aligner is positioned between an X-ray extraction window and a mask so that the X-ray extraction window and the mask cannot be brought close to each other. When X-rays extracted from the X-ray extraction window pass through air and reach the wafer, the intensity of X-rays is attenuated. In view of this, the space between the X-ray extraction window and the mask is desired to be filled with a gas having a high X-ray transmittance. In this embodiment, a gas having a high X-ray transmittance, such as helium, is introduced into an X-ray extraction chamber 35 from a gas inlet 35A and exhausted from an gas outlet 35B. The third film 11C serves as a film for separating the X-ray extraction chamber and the atmosphere. The mask and the wafer are placed close to the third film. Since the distance between the first and second films is short and the space between the second and third films is filled with helium, the intensity of X-rays is less attenuated even in such a triple film structure. Any film may be used as the third film in so far as to the X-ray transmittance of the film is high. Usable examples of the third film include thin metallic films of beryllium, aluminum, titanium, etc.; inorganic films of carbon, Si-N, SiN$_4$, SiC, BN, etc.; organic films of polyelhylene, polyehylene terephthalate, polyimide, etc.; and composite films thereof. A films as thin as 1 $\mu$m or less can be used.

Since the individual films can be thin, the X-ray transmittance can be increased as a whole in such a triple film structure of the X-ray extraction window. Besides, when an upper electrode having a through hole 31 is used, the dose of the particle beam emitted toward the X-ray extraction window is small. Accordingly, the first film can be rendered thin so that the intensity of the X-ray extracted can be increased.

Embodiment 6

Figure 17:
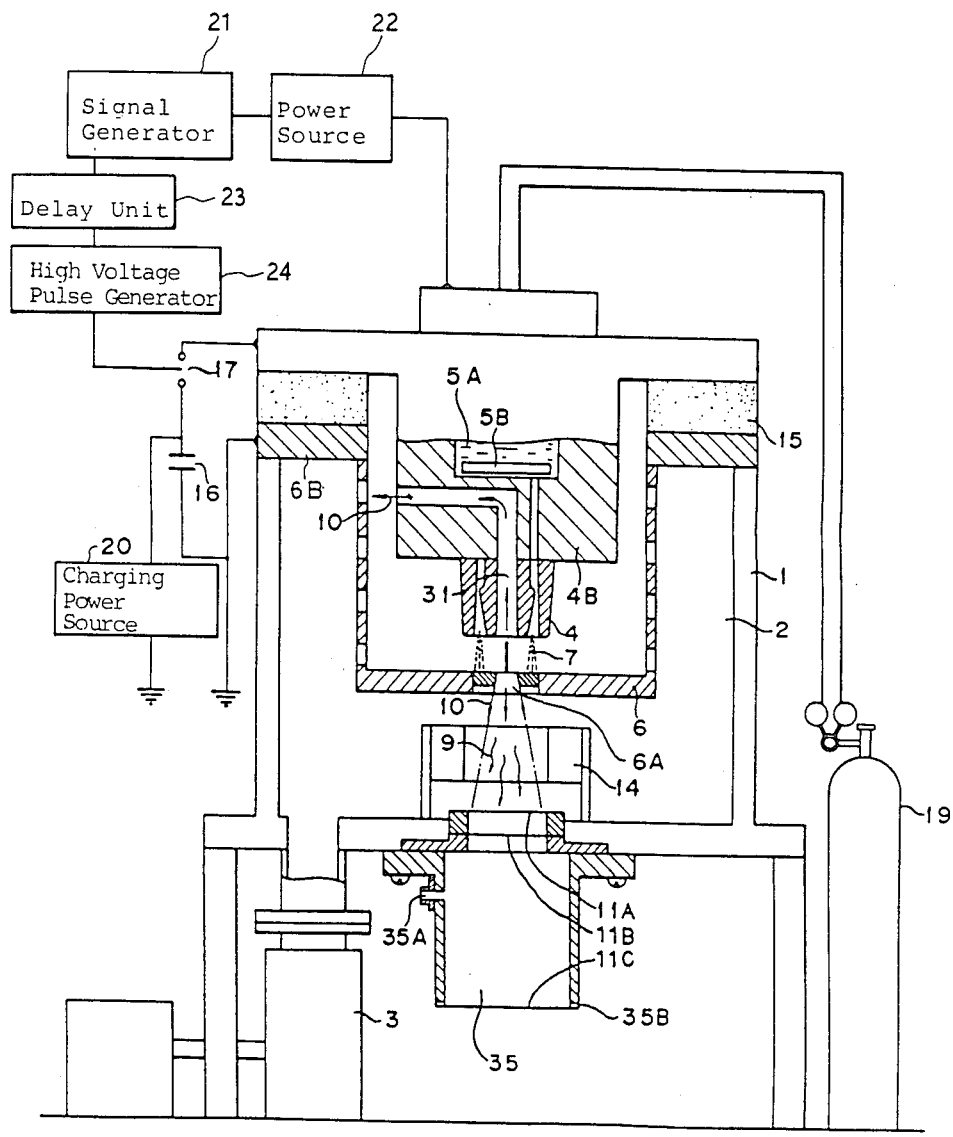

FIG. 17 shows still another embodiment of the present invention. The apparatus in this embodiment additionally comprises a charged particle remover 14 in the structure of the example as shown in FIG. 16. Due to a combination of an upper electrode 4 having a through hole 31 and the charged particle remover 14 with an X-ray extraction window 11 having a multiple film structure, the damage of the X-ray extraction window can be reduced, the thickness of the X-ray extraction window material ca be decreased, and the intensity of X-rays extracted can be raised.

Embodiment 7

Figure 18:
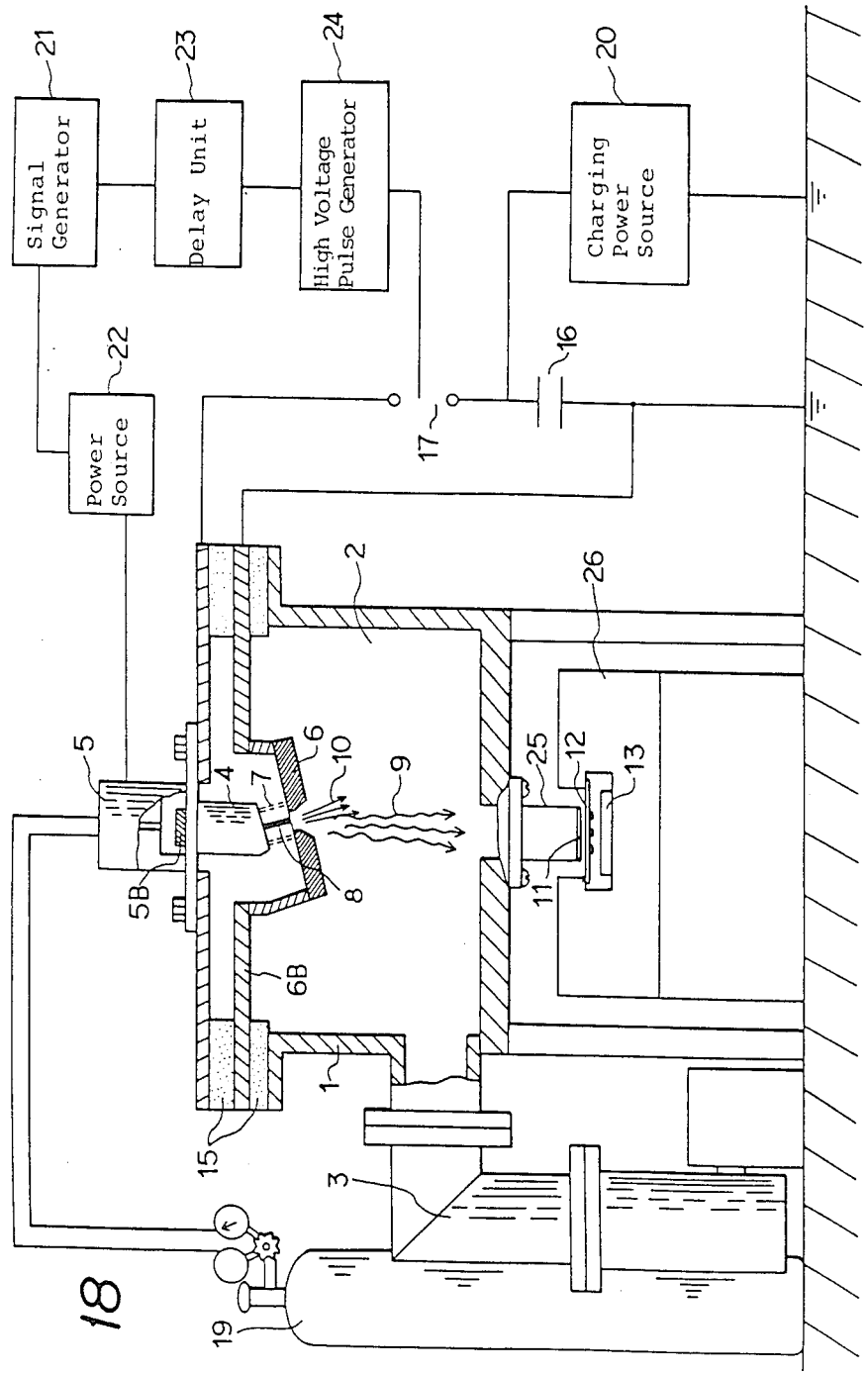
Figure 19:
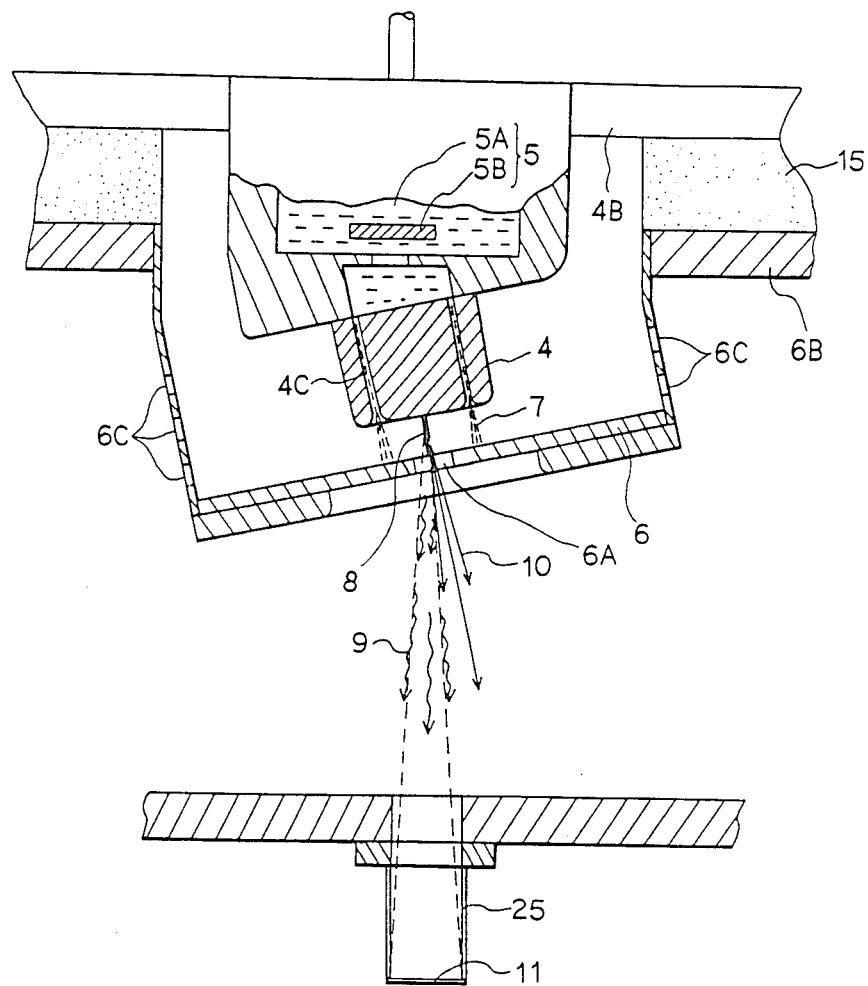

FIG. 18 illustrates an X-ray lithography apparatus using an embodiment of the X-ray source according to the present invention, while FIG. 19 shows an enlarged cross-sectional view of the discharge electrodes of the apparatus. The same parts in FIGS. 18 and 19 as in the conventional apparatus as shown in FIG. 1 are accompanied by the same reference numbers as in FIG. 1, and descriptions thereabout will be omitted. The apparatus includes an X-ray exposure pipe 25 and an aligner 26 for alignment of a mask 12 with a wafer 13. The most notable difference of this embodiment from the conventional X-ray sources consists in that the central axis of a set of electrodes for forming a plasma is so inclined relative to the normal line direction of an X-ray extraction window as to dispose the central position of the X-ray extraction window apart from an extension line in the axial direction of the plasma. In the same manner as in the conventional apparatus described hereinbefore, the vacuum chamber 2 is evacuated and a gas is injected between both discharge electrodes 4 and 6, across which a high electric field is then applied to form a plasma of the injected gas. The pinched plasma emits X-rays. Besides X-rays 9, ions, electrons, a high temperature gas, etc., which are generated in the course of collapse of a high density plasma, are released from the plasma 8 pinched between the electrodes. The X-rays are substantially isotropically radiated from all points of the plasma towards the surroundings, whereas a particle beam 10 composed of the ions, the electrons, the high temperature gas, etc. is emitted mainly in the axial direction of the plasma so that it can hardly reach the X-ray extraction window 11.

FIG. 20 shows the state of that damage of an aluminum foil placed at a position about 15 cm apart from the lower electrode which is inflicted by the particle beam emitted from the plasma. As shown in FIG. 20, the damage of the aluminum foil is concentrated around the central portion of the foil, while the damage markedly dwindles in a portion 2 to 3 cm apart from the central portion of the foil. In this example, the damage of the X-ray extraction window 11 due to the particle beam is substantially negligible since the window is structurally disposed at a given angle with the axial direction of the plasma 8.

Figure 21:
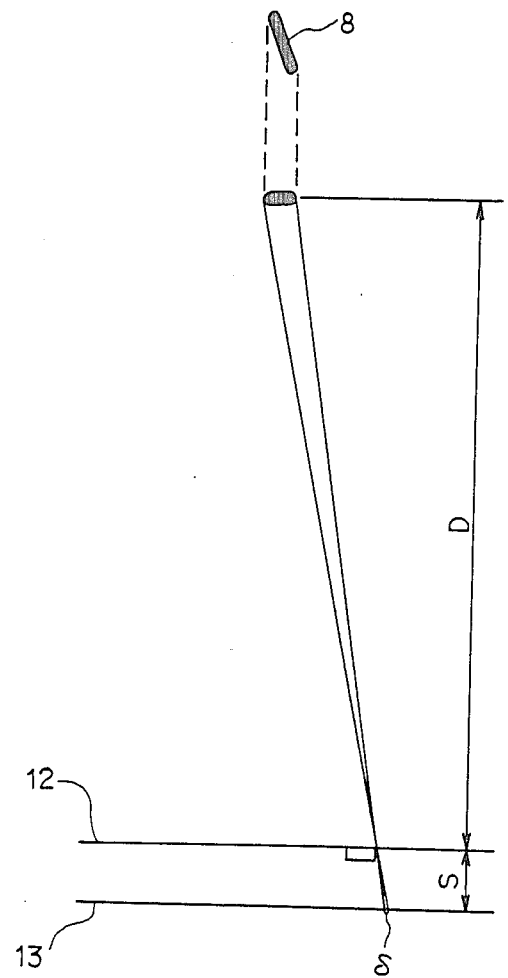
FIG. 21 illustrates a penumbral blur δ in X-ray lithography.

On the other hand, as shown in FIG. 21, the penumbral blur $\delta = 2$ rs/D of X-ray exposure is caused, wherein 2r is the diameter of the source of X-rays, s is the distance of a wafer from the mask, and D is the distance of the mask from the source of X-rays. The diameter of the source of X-rays increases since the source becomes elliptical when the source is viewed from the X-ray extraction window disposed at a given angle with the axial direction of the plasma. The substantial diameter of the source of X-rays is about 3 mm or smaller due to an X-ray intensity distribution having high intensities around the central portion of the source. In this case, the penumbral blur $\delta = 0.15$ $\mu$m or less, which is not large as compared with that in the conventional apparatus using electron impact X-ray source. This does not constitute any block to the use of the apparatus in this example as an X-ray lithography apparatus for replication of a 0.5 $\mu$m pattern.

FIG. 22 shows the relationship between the X-ray extraction angle, namely the angle of the normal line direction of the X-ray extraction window with the axial direction of the plasma, the penumbral blur (curve A), and the arriving ion dose (curve B). The distance between the source of X-rays and the mask is 24 cm. The penumbral blur was calculated from a gap length (distance between the wafer and the mask) of 10 $\mu$m or 15 $\mu$m. The arriving ion dose was measured by a Faraday cup placed in the central portion of the X-ray extraction window. The arriving ion dose decreases with an increasing X-ray extraction angle. When X-ray extraction angles are 5°, 10° and 15°, the arriving ion doses are respectively decreased to about 50%, 20% and 5% of the value at an X-ray extraction angle of 0° C., namely the value in the conventional apparatus. Thus, the damage of the X-ray extraction window can be markedly prevented by extracting X-rays with a given inclination relative to the axial direction of the plasma. On the other hand, the penumbral blur increases with an increasing X-ray extraction angle. In the case of a gap length of 15 $\mu$m as a practical value, the penumbral blur is about 0.2 $\mu$m, 0.3 $\mu$m, and 0.35 $\mu$m at X-ray extraction angles of 10°, 15° and 20°, respectively. In other words, the damage-prevent effect is exhibited even at an X-ray extraction angle of 5°, while the value of the penumbral blur is practically permissible in a range up to 20°. It is a matter of course that the peripheries of the X-ray extraction window, the mask, and the wafer be kept in a symmetrical relation relative to the source of X-rays for preventing non-uniform exposure and pattern shift.

Embodiment 8

Figure 23:
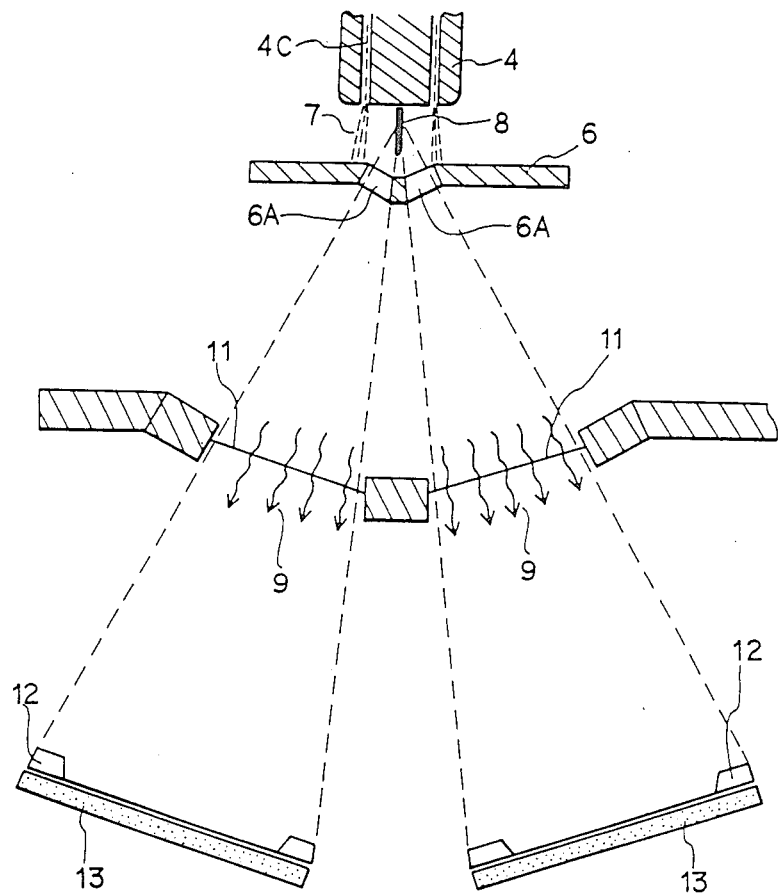
FIG. 23 is a partial cross-sectional view of another example of the present invention.

FIG. 23 shows another embodiment of the present invention. This embodiment has a structure comprising a plurality of X-ray extraction windows each disposed in a direction inclined at a given angle with the axis of a plasma instead of inclination of the source of X-rays, and allowing a wafer and a mask to be set on the extended line of that direction. A plurality of meshes or holes 6A are disposed in a lower electrode 6 confronting an upper electrode 4. X-rays are extracted from a plurality of X-ray extraction windows 11 and a wafer 13 is irradiated with the X-rays through a mask 12. Since a particle beam 9 emitted from a pinched plasma 8 is almost concentrated in the axial direction of the plasma, the damage of the X-ray extraction windows 11 is small, as compared with that of any X-ray extraction window disposed in the axial direction of the plasma. Thus, it is possible to reduce the thickness of the X-ray extraction windows made of beryllium or the like. Furthermore, a plurality of wafers can be exposed in a single exposure operation due to the presence of a plurality of the X-ray extraction windows. In this embodiment, the lower electrode has no hole in the axial direction of the plasma. Even if a hole is provided in the axial direction of the plasma, the same effect as in this embodiment can be, of course, attained.

Embodiment 9

Figure 24:
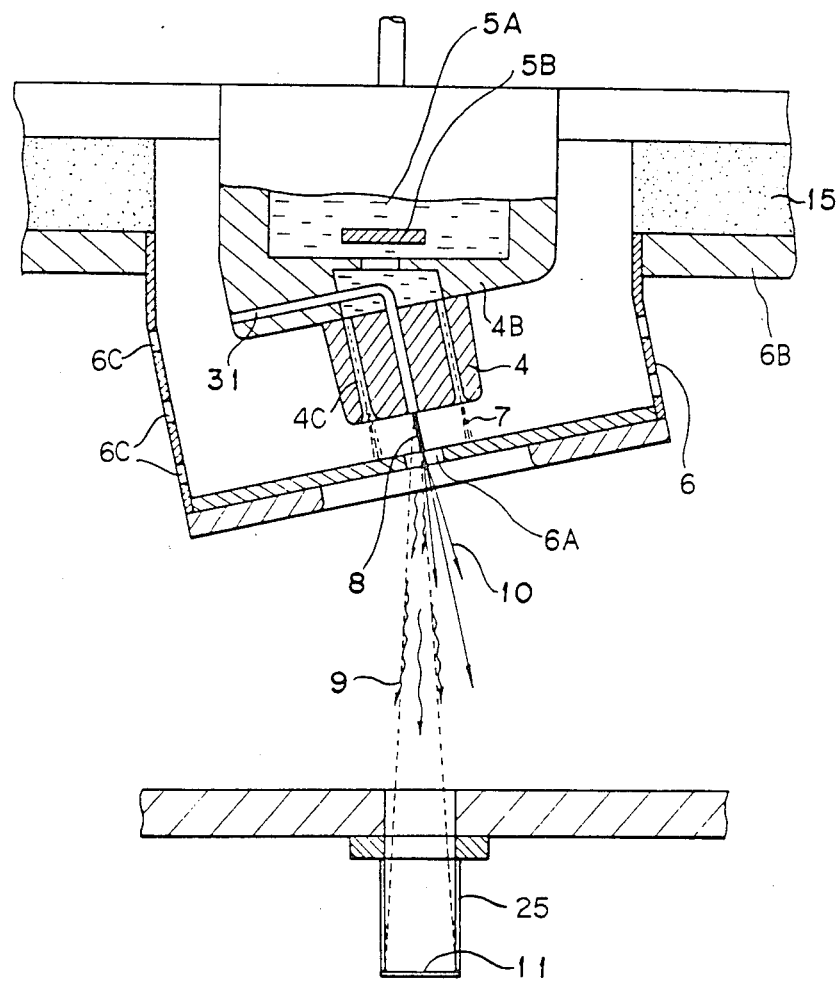
FIGS. 24 and 25 are concerned with examples wherein a discharged electrode has a through hole and the center of an X-ray extraction window is slightly shifted from the axial direction of the plasma.

FIG. 24 shows still another embodiment of the present invention. In the figure, only discharge electrodes and an X-ray extraction window are shown. This embodiment is a combination of the electrode structure as shown in FIG. 6 and the mode of X-ray extraction as shown in FIGS. 18 and 19. More specifically, the characteristic features of this embodiment consists in that a through hole 31 is provided in an upper electrode 4, and the direction of the X-ray extraction is inclined relative to the axial direction of a plasma 8 to be formed. The central position of the X-ray extracting window 11 is, therefore, apart from the extension line in the axial direction of the plasma 8. The same effect of the through hole 31 as described in the preceding embodiments is exhibited in this embodiment, too. X-rays 9 generated from the pinched plasma 8 are isotropically radiated from all points of the plasma toward the surroundings, while ions, electrons, a high temperature gas, etc. are emitted mainly in the axial direction of the plasma. In the X-ray source having the structure as shown in FIG. 24, the X-ray extraction window 11 is irradiated with X-rays 9, while the particle beam 10 emitted toward a lower electrode 6 without being exhausted through the through hole 31 hardly collides with the X-ray extraction window 11. The same effect of providing an angle of the central axis of the upper and lower electrodes, i.e., axial direction of plasma, with the direction of the X-ray extraction as described with reference to FIG. 22 is exhibited in this embodiment, too. In the X-ray lithography apparatus using this embodiment, the damage of the X-ray extraction window can be further reduced by the effect as mentioned just above, coupled with the effect of the through hole 31. As a result, not only a thin film can be used as the X-ray extraction window, but also the distance of the X-ray extraction window from the source of X-rays can be shortened, leading to high efficiency utilization of X-rays generated from the plasma.

A charged particle remover 14, as shown in FIG. 8 or a plasma remover having not only a charged particle remover but also a plasma reflection plate may be additionally provided in the X-ray lithography apparatus as shown in FIG. 24. In this case, the X-ray extraction efficiency can be further improved.

Figure 25:
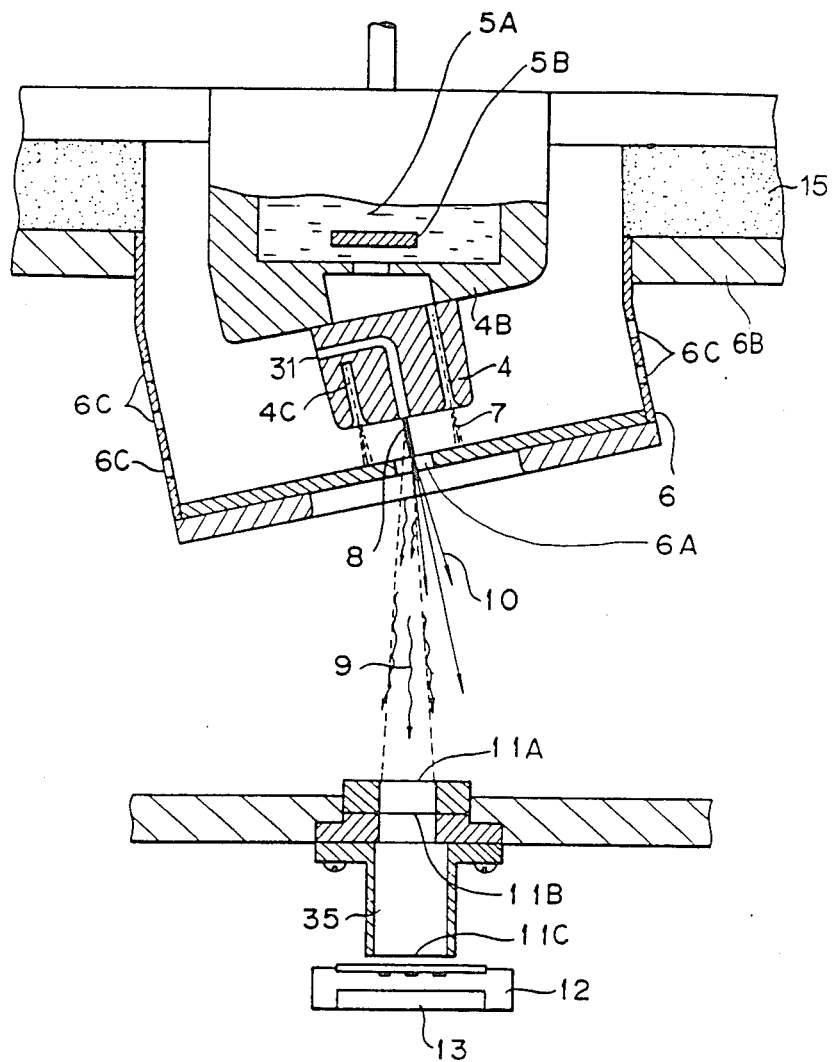

As shown in FIG. 25, an X-ray extraction window 11 having a triple film structure comprising films 11A, 11B and 11C may be provided with the normal line thereof inclined relative to the central axis of electrodes including an upper electrode 4 having a through hole 31. In the structures as shown in FIG. 25, the effect of the through hole 31, the effect of the X-ray extraction window having a triple film structure, and the effect of inclination of the central axis of the discharge electrodes relative to the direction of the X-ray extraction are synergistic. Therefore, X-rays emitted from the plasma can be highly efficiently utilized, leading to an improvement in throughput.

Additionally stated, in the case of not only the combination of a discharge electrode having a through hole and an X-ray extraction window having a triple film structure but also the combination of inclination of the central axis of the discharge electrodes relative to the direction of the X-ray extraction in addition to the above-mentioned combination, the form of the through hole is needless to say, not limited to those of the embodiments as shown in FIGS. 16, 24 and 25. A gas plenum 5A and a piston 5B for gas injection are preferably disposed inside a flange from the viewpoint of quick gas injection. Alternatively, however, they may be disposed outside the flange while only a gas passage is disposed inside the electrode.

Embodiment 10

Figure 26:
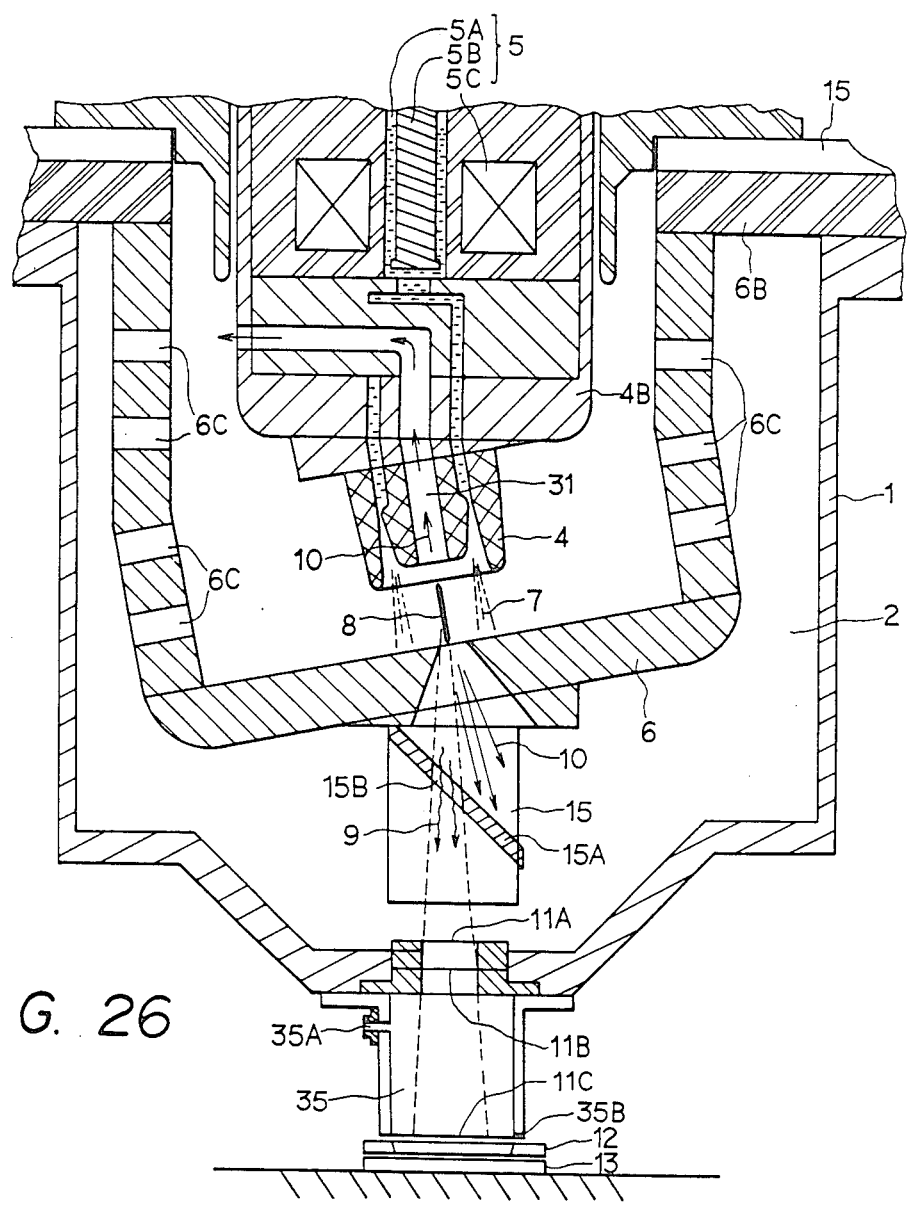
FIG. 26 is concerned with an example wherein a discharge electrode has a through hole and the center of the X-ray extraction window is slightly shifted from the axial direction of the plasma and the window has a triple window structure.

FIG. 26 shows the cross-sectional view of a most significant embodiment of the X-ray source according to the present invention. The figure includes a solenoid 5C for driving a piston 5B of a fast acting puff valve 5. A gas jet 7 is injected between electrodes 4 and 6 through the fast acting puff valve, followed by formation of a plasma. Since a through hole 31 is provided in the upper electrode 4, a particle beam 10 of charged particles, a high temperature gas etc. is exhausted through the through hole 31, so that the dose of the particle beam flying toward an X-ray extraction window 11 is decreased. Since the normal line direction of the electrodes 4 and 6 (namely the axial direction of the plasma) is inclined relative to the direction of the X-ray extraction, the dose of the particle beam flying toward the X-ray extraction window is further decreased. A particle beam remover 15 having particle beam reflection plate 15A provided in a magnetic field formed by a pair of permanent magnets or electromagnets confronting each other in a charged particle remover as mentioned hereinbefore is disposed under the lower electrode 6. In this figure, the magnets are supposed to be so disposed as to form a magnetic field in a direction perpendicular to the surface of the paper including figure. Thus, they do not appear in the figure. The particle beam reflection plate 15A has an X-ray passage hole 15B in the middle thereof, and disposed inclined relative to the axis of the plasma. Charged particles flying into the particle beam remover 15 are deflected by the magnetic field formed by the magnets, while non-charged particles as well as less deflected charged particles collide against the particle beam reflection plate 15A to be reflected therefrom. As a result, the dose of the particle beam of charged particles and a high temperature gas, etc. reaching the X-ray extraction window 11 through the X-ray passage hole 15B is remarkably decreased. Accordingly, the thickness of the X-ray extraction window can be reduced to raise the X-ray extraction efficiency, thus enabling X-rays to be extracted at a high output. In this embodiment, furthermore, the X-ray extraction window comprises mutually separate films, namely a first film 11A for resisting against light energy including those of visible and ultraviolet rays and a second film 11B for bearing a pressure difference between the vacuum chamber 2 and the atmosphere. This allows the thickness of the X-ray extraction window to be further reduced. He gas having a high X-ray transmittance is introduced into an X-ray extraction chamber 35 between the second film 11B and a third film 11C through a gas inlet 35A and exhausted from a gas outlet 35B to provide therein the same pressure as the atmospheric pressure. This allows the third film 11C to be thin. Therefore, X-rays extracted into an atmosphere having the same pressure as the atmospheric pressure are radiated onto a mask 12 with only a little attenuation of the intensity thereof.

In this embodiment, a mask pattern of 0.3 $\mu$m in width could be replicated onto a wafer when the axis of the plasma was inclined at an angle of 10° with the normal line direction of the X-ray extraction window and the distance between the mask and the wafer was set at 15 $\mu$m.

As described above, according to the present invention, the following advantages can be attained.

Reflection of high energy particles from the upper electrode during collapse of the plasma is reduced by using the hollow electrode, so that a high efficiency of X-ray extraction and a prolonged life span of the X-ray extraction window can be attained. The electrode loss can be reduced by using a pair of hollow electrodes. Since exhaustion of an excess gas after discharging can be performed by utilizing the hollow portion of the hollow electrode, the discharge stability during high frequency operation can be improved.

The damage to the X-ray extraction window can be largely reduced by inclining the central axis of the plasma relative to the vertical direction while extracting X-rays vertically downward. Accordingly, the X-ray extraction window having a wide area and a high X-ray transmittance can be used.

The triple film structure of the X-ray extraction window allows the thicknesses of the films to be thin due to respective functions borne thereby, so that X-rays can be efficiently extracted.

Replication of the pattern in the order of submicrons is possible since X-rays can be extracted from the source of X-rays having a small diameter.

The gas injection type X-ray source becomes practically usable thanks to the present invention. Thus, a throughput 10 times or more as high as that in the conventional electron excitation type X-rays source can be acquired.

The X-ray source according to the present invention can be employed not only in an X-ray lithography apparatus for manufacturing integrated circuits but also in an X-ray analyzer, an X-ray microscope, a chemical reactor utilizing X-ray excitation, a film forming apparatus utilizing X-ray excitation, and an etching apparatus utilizing X-ray excitation for attaining miniaturization of each apparatus or promotion of any reaction.

What is claimed is:

1. An X-ray source comprising:
   a pair of electrodes opposing each other in a vacuum chamber for forming a linear plasma, each electrode having a through hole wherein the through hole of one electrode is directly opposite the through hole of the other electrode and both through holes are in line with said linear plasma, said through holes communicating with vacuum;
   a gas valve for introducing a gas for forming a plasma between said pair of electrodes;
   means for applying an electric field to at least one of said electrodes to cause discharge between said pair of electrodes to form a discharge plasma for emitting X-rays from a pinched linear plasma of said discharge plasma; and
   an X-ray extraction window for extracting X-rays emitted from said plasma out of said vacuum chamber.

2. An X-ray source as claimed in claim 1, wherein said through hole of one of said pair of electrodes has branches.

3. An X-ray source as claimed in claim 1, wherein said through hole of one electrode of said pair of electrodes is communicated with a vacuum evacuator.

4. An X-ray source as claimed in claim 1, further comprising a charged particle remover capable of deflecting charged particles by a magnetic field formed by a pair of magnets disposed between said electrodes and said X-ray extraction window.

5. An X-ray source as claimed in claim 4, further comprising a particle beam reflection plate provided in said magnetic field.

6. An X-ray source as claimed in claim 1, wherein said X-ray extraction window comprises a first film for resisting thermal energy and light energy emitted from said plasma, a second film for sealing said vacuum chamber and a third film disposed on an outer side of said X-ray extraction window via a helium gas filled between said third film and said second film.

7. An X-ray source as claimed in claim 4, wherein said X-ray extraction window comprises a first film for resisting thermal energy and light energy emitted from said plasma, a second film for sealing said vacuum chamber and a third film disposed on an outer side of said X-ray extraction window via a helium gas filled between said third film and said second film.

8. An X-ray source as claimed in claim 5, wherein said X-ray extraction window comprises a first film for resisting thermal energy and light energy emitted from said plasma, a second film for sealing said vacuum chamber and a third film disposed on an outer side of said X-ray extraction window via a helium gas filled between said third film and said second film.

9. An X-ray source comprising:
   a pair of electrodes opposing each other in a vacuum chamber for forming a linear plasma, each electrode having a through hole wherein the through hole of one electrode is directly opposite the through hole of the other electrode and both through holes are in line with said linear plasma, said through holes communicating with vacuum;
   a gas valve for injecting a gas capable of forming a plasma between said pair of electrodes;
   means for applying an electric field to at least one of said electrodes to cause discharging between said pair of electrodes to form a discharge plasma for effecting emission of X-rays from a pinched linear plasma of said discharge plasma; and an X-ray extraction window for extracting X-rays emitted from said plasma out of said vacuum chamber in a direction slightly inclined relative to the axial direction of said plasma, so that a particle beam emitted from said plasma does not impinge against said X-ray extracting window.

10. An X-ray source as claimed in claim 9, wherein said through hole of one of said pair of electrodes has branches.

11. An X-ray source as claimed in claim 9, wherein said through hole of one electrode of said pair of electrodes is communicated with a vacuum evacuator.

12. An X-ray source as claimed in claim 9, further comprising a charged particle remover capable of deflecting charged particles by a magnetic field formed by a pair of magnets disposed between said electrodes and said X-ray extraction window.

13. An X-ray source as claimed in claim 12, further comprising a particle beam reflection plate provided in said magnetic field.

14. An X-ray source as claimed in claim 9, wherein said X-ray extraction window comprises a first film for resisting thermal energy and light energy emitted from said plasma, a second film for sealing said vacuum chamber and a third film disposed on an outer side of said X-ray extraction window via a helium gas filled between said third film and said second film.

15. An X-ray source as claimed in claim 12, wherein said X-ray extraction window comprises a first film for resisting thermal energy and light energy emitted from said plasma, a second film for sealing said vacuum chamber and a third film disposed on an outer side of said X-ray extraction window via a helium gas filled between said third film and said second film.

16. An X-ray source as claimed in claim 13, wherein said X-ray extraction window comprises a first film for resisting thermal energy and light energy emitted from said plasma, a second film for sealing said vacuum chamber and a third film disposed on an outer side of said X-ray extraction window via a helium gas filled between said third film and said second film.

* * * * *